(12) United States Patent
Tsai et al.

(10) Patent No.: US 12,381,195 B2
(45) Date of Patent: Aug. 5, 2025

(54) SEMICONDUCTOR DEVICES AND METHODS OF MANUFACTURE THEREOF

(71) Applicant: Taiwan Semiconductor Manufacturing Co., Ltd., Hsinchu (TW)

(72) Inventors: Shu-Ting Tsai, Kaohsiung (TW); Dun-Nian Yaung, Taipei (TW); Jen-Cheng Liu, Hsinchu (TW); Szu-Ying Chen, Hsinchu (TW); U-Ting Chen, Wanluan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 458 days.

(21) Appl. No.: 17/696,565

(22) Filed: Mar. 16, 2022

(65) Prior Publication Data
US 2022/0208749 A1     Jun. 30, 2022

Related U.S. Application Data

(60) Continuation of application No. 16/421,254, filed on May 23, 2019, now abandoned, which is a
(Continued)

(51) Int. Cl.
*H01L 25/00* (2006.01)
*H01L 21/768* (2006.01)
(Continued)

(52) U.S. Cl.
CPC ........ *H01L 25/50* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS

| 4,956,312 A | 9/1990 | Van Laarhoven |
| 6,111,319 A | 8/2000 | Liou et al. |
| (Continued) | | |

FOREIGN PATENT DOCUMENTS

| CN | 101840925 A | 9/2010 |
| CN | 102299133 A | 12/2011 |
| (Continued) | | |

OTHER PUBLICATIONS

Quirk, M., et al., "Semiconductor Manufacturing Technology," 2001, Prentice Hall, Inc., Chapter 12, p. 300.
(Continued)

*Primary Examiner* — Telly D Green
(74) *Attorney, Agent, or Firm* — Slater Matsil, LLP

(57) ABSTRACT

Semiconductor devices and methods of manufacture thereof are disclosed. In some embodiments, a semiconductor device includes a first semiconductor chip including a first substrate and a first conductive feature formed over the first substrate, and a second semiconductor chip bonded to the first semiconductor chip. The second semiconductor chip includes a second substrate and a second conductive feature formed over the second substrate. A conductive plug is disposed through the first conductive feature and is coupled to the second conductive feature. The conductive plug includes a first portion disposed over the first conductive feature, the first portion having a first width, and a second portion disposed beneath or within the first conductive feature. The second portion has a second width. The first width is greater than the second width.

20 Claims, 15 Drawing Sheets

Related U.S. Application Data continuation of application No. 15/836,580, filed on Dec. 8, 2017, now Pat. No. 10,304,818, which is a division of application No. 14/141,000, filed on Dec. 26, 2013, now abandoned.

(51) Int. Cl.
  *H01L 23/00* (2006.01)
  *H01L 23/48* (2006.01)
  *H01L 25/065* (2023.01)

(52) U.S. Cl.
  CPC .............. *H01L 24/24* (2013.01); *H01L 24/73* (2013.01); *H01L 24/82* (2013.01); *H01L 24/92* (2013.01); *H01L 25/0657* (2013.01); *H01L 21/76805* (2013.01); *H01L 24/08* (2013.01); *H01L 24/80* (2013.01); *H01L 2224/08145* (2013.01); *H01L 2224/2405* (2013.01); *H01L 2224/24146* (2013.01); *H01L 2224/24147* (2013.01); *H01L 2224/245* (2013.01); *H01L 2224/73201* (2013.01); *H01L 2224/73251* (2013.01); *H01L 2224/80894* (2013.01); *H01L 2224/80895* (2013.01); *H01L 2224/80896* (2013.01); *H01L 2224/82101* (2013.01); *H01L 2224/82106* (2013.01); *H01L 2224/82931* (2013.01); *H01L 2224/82947* (2013.01); *H01L 2224/9202* (2013.01); *H01L 2224/9212* (2013.01); *H01L 2224/9222* (2013.01); *H01L 2225/06544* (2013.01); *H01L 2225/06565* (2013.01); *H01L 2924/00014* (2013.01); *H01L 2924/0002* (2013.01)

(56) References Cited

U.S. PATENT DOCUMENTS

| | | |
|---|---|---|
| 6,207,494 B1 | 3/2001 | Graimann et al. |
| 7,453,150 B1 | 11/2008 | McDonald |
| 7,485,968 B2 | 2/2009 | Enquist et al. |
| 7,528,066 B2 * | 5/2009 | Yang ............... H01L 21/76805 |
| | | 438/618 |
| 7,535,920 B2 | 5/2009 | Robertson |
| 7,642,173 B2 | 1/2010 | McDonald |
| 7,973,415 B2 | 7/2011 | Kawashita et al. |
| 8,125,052 B2 | 2/2012 | Jeng et al. |
| 8,153,521 B2 | 4/2012 | Kang et al. |
| 8,158,515 B2 | 4/2012 | Farooq et al. |
| 8,324,736 B2 | 12/2012 | Kawashita et al. |
| 8,344,514 B2 | 1/2013 | Cobbley et al. |
| 8,358,008 B2 | 1/2013 | Wada et al. |
| 8,415,806 B2 | 4/2013 | Zhu |
| 8,421,193 B2 | 4/2013 | Huang |
| 8,525,345 B2 | 9/2013 | Yen et al. |
| 8,581,414 B2 | 11/2013 | Fujita |
| 8,592,991 B2 | 11/2013 | Lee et al. |
| 8,610,259 B2 | 12/2013 | Oganesian et al. |
| 8,643,074 B2 | 2/2014 | Pai et al. |
| 8,692,382 B2 | 4/2014 | Yen et al. |
| 8,729,711 B2 | 5/2014 | Nishio |
| 8,872,345 B2 | 10/2014 | Hsieh et al. |
| 8,884,431 B2 | 11/2014 | Lin et al. |
| 8,933,544 B2 | 1/2015 | Mao et al. |
| 9,006,804 B2 | 4/2015 | Hung et al. |
| 9,041,206 B2 | 5/2015 | Tsai et al. |
| 9,059,696 B1 | 6/2015 | Rahman |
| 9,076,664 B2 | 7/2015 | Pelley et al. |
| 9,192,016 B1 | 11/2015 | Athalye et al. |
| 9,287,197 B2 | 3/2016 | Lin et al. |
| 9,412,719 B2 | 8/2016 | Tsai et al. |
| 9,431,448 B2 | 8/2016 | Okamoto |
| 9,449,914 B2 | 9/2016 | Ho et al. |
| 9,455,158 B2 | 9/2016 | Tsai et al. |
| 11,798,916 B2 | 10/2023 | Tsai et al. |
| 2002/0123219 A1 | 9/2002 | Laverty et al. |
| 2004/0073695 A1 | 4/2004 | Robertson |
| 2006/0073695 A1 | 4/2006 | Filippi et al. |
| 2006/0286767 A1 | 12/2006 | Clarke et al. |
| 2007/0037379 A1 | 2/2007 | Enquist et al. |
| 2007/0072422 A1 | 3/2007 | Yeh |
| 2007/0117348 A1 | 5/2007 | Ramanathan et al. |
| 2007/0205482 A1 * | 9/2007 | Yang ............... H01L 21/76831 |
| | | 257/E21.25 |
| 2008/0150089 A1 | 6/2008 | Kwon et al. |
| 2008/0284041 A1 | 11/2008 | Jang et al. |
| 2009/0014843 A1 | 1/2009 | Kawashita et al. |
| 2009/0079077 A1 * | 3/2009 | Yang ............... H01L 21/76846 |
| | | 257/E23.141 |
| 2009/0134432 A1 | 5/2009 | Tabata et al. |
| 2009/0166840 A1 | 7/2009 | Kang et al. |
| 2010/0090317 A1 | 4/2010 | Zimmermann et al. |
| 2010/0096718 A1 | 4/2010 | Hynecek et al. |
| 2010/0171196 A1 | 7/2010 | Steadman et al. |
| 2010/0193964 A1 | 8/2010 | Farooq et al. |
| 2010/0200833 A1 | 8/2010 | Sim et al. |
| 2010/0207226 A1 | 8/2010 | Park et al. |
| 2010/0224876 A1 | 9/2010 | Zhu |
| 2010/0238331 A1 | 9/2010 | Umebayashi et al. |
| 2010/0264551 A1 | 10/2010 | Farooq et al. |
| 2011/0062501 A1 | 3/2011 | Soss et al. |
| 2011/0100697 A1 * | 5/2011 | Yang ............... H01L 21/76831 |
| | | 174/262 |
| 2011/0133339 A1 | 6/2011 | Wang |
| 2011/0171582 A1 * | 7/2011 | Farooq ............. H01L 21/76898 |
| | | 430/314 |
| 2011/0171827 A1 | 7/2011 | Farooq et al. |
| 2011/0193197 A1 | 8/2011 | Farooq et al. |
| 2011/0221070 A1 | 9/2011 | Yen et al. |
| 2012/0038020 A1 | 2/2012 | Lin et al. |
| 2012/0038028 A1 | 2/2012 | Yaung et al. |
| 2012/0056323 A1 | 3/2012 | Zhu |
| 2012/0056330 A1 | 3/2012 | Lee et al. |
| 2012/0061795 A1 | 3/2012 | Yen et al. |
| 2012/0074582 A1 | 3/2012 | Yu et al. |
| 2012/0074584 A1 | 3/2012 | Lee et al. |
| 2012/0091593 A1 | 4/2012 | Cheng et al. |
| 2012/0126394 A1 | 5/2012 | Huang |
| 2012/0181698 A1 | 7/2012 | Xie et al. |
| 2012/0193785 A1 | 8/2012 | Lin et al. |
| 2012/0261827 A1 | 10/2012 | Yu et al. |
| 2012/0292730 A1 | 11/2012 | Tsai et al. |
| 2013/0009317 A1 | 1/2013 | Hsieh et al. |
| 2013/0009321 A1 | 1/2013 | Kagawa et al. |
| 2013/0062761 A1 | 3/2013 | Lin et al. |
| 2013/0093098 A1 | 4/2013 | Yang et al. |
| 2013/0140680 A1 | 6/2013 | Harada et al. |
| 2013/0264688 A1 | 10/2013 | Qian et al. |
| 2013/0267093 A1 | 10/2013 | Birner et al. |
| 2013/0270625 A1 | 10/2013 | Jang et al. |
| 2013/0292794 A1 | 11/2013 | Pai et al. |
| 2013/0309838 A1 | 11/2013 | Wei et al. |
| 2013/0330889 A1 | 12/2013 | Yin et al. |
| 2014/0070426 A1 | 3/2014 | Park et al. |
| 2014/0084375 A1 | 3/2014 | Lee et al. |
| 2014/0175653 A1 | 6/2014 | Sandhu et al. |
| 2014/0203448 A1 | 7/2014 | Song et al. |
| 2014/0231986 A1 | 8/2014 | Dubin |
| 2014/0247380 A1 | 9/2014 | Hynecek |
| 2014/0264709 A1 | 9/2014 | Tsai et al. |
| 2014/0264862 A1 | 9/2014 | Tsai et al. |
| 2014/0264911 A1 | 9/2014 | Lin et al. |
| 2014/0264929 A1 | 9/2014 | Tsai et al. |
| 2014/0264947 A1 | 9/2014 | Lin et al. |
| 2014/0361347 A1 | 12/2014 | Kao |
| 2014/0361352 A1 | 12/2014 | Hung et al. |
| 2015/0129942 A1 | 5/2015 | Kao |
| 2015/0137238 A1 | 5/2015 | Tsunemi et al. |
| 2015/0179612 A1 | 6/2015 | Tsai et al. |
| 2015/0179613 A1 | 6/2015 | Tsai et al. |
| 2015/0187701 A1 | 7/2015 | Tsai et al. |
| 2015/0221695 A1 | 8/2015 | Park et al. |
| 2015/0228584 A1 | 8/2015 | Huang et al. |
| 2015/0243582 A1 | 8/2015 | Klewer |

(56) References Cited

U.S. PATENT DOCUMENTS

| | | |
|---|---|---|
| 2015/0348874 A1 | 12/2015 | Tsai et al. |
| 2015/0348917 A1 | 12/2015 | Tsai et al. |
| 2016/0005866 A1 | 1/2016 | Wu et al. |
| 2016/0020170 A1 | 1/2016 | Ho et al. |
| 2016/0086997 A1 | 5/2016 | Okamoto |
| 2021/0313225 A1 | 10/2021 | Enquist et al. |

FOREIGN PATENT DOCUMENTS

| | | |
|---|---|---|
| CN | 102339813 A | 2/2012 |
| CN | 102468279 A | 5/2012 |
| CN | 102569314 A | 7/2012 |
| CN | 102867777 A | 1/2013 |
| CN | 103000593 A | 3/2013 |
| CN | 103367348 A | 10/2013 |
| CN | 104051414 A | 9/2014 |
| JP | 2008305897 | 12/2008 |
| JP | 2010114165 A | 5/2010 |
| JP | 2013251511 | 12/2013 |
| KR | 20100094905 A | 8/2010 |
| KR | 1020100094905 A | 8/2010 |
| KR | 20130116607 A | 10/2013 |
| KR | 20140000719 | 1/2014 |
| WO | 2011033601 A1 | 3/2011 |
| WO | 2012006766 A1 | 1/2012 |
| WO | 2013118618 A1 | 8/2013 |

OTHER PUBLICATIONS

Quirk, Michael et al., "Semiconductor Manufacturing Technology," 2001, Prentice-Hall, Inc, Chapter 12, p. 300.

* cited by examiner

SEMICONDUCTOR DEVICES AND METHODS OF MANUFACTURE THEREOF

CROSS-REFERENCE TO RELATED APPLICATIONS

This application is a continuation of application Ser. No. 16/421,254, filed on May 23, 2019, which is a continuation of application Ser. No. 15/836,580, filed Dec. 8, 2017, now U.S. Pat. No. 10,304,818, issued on May 28, 2019, which is a divisional of application Ser. No. 14/141,000, filed on Dec. 26, 2013 which relates to the following co-pending and commonly assigned patent application: Ser. No. 13/839,860, filed on Mar. 15, 2013, entitled, "Interconnect Structure and Method," now U.S. Pat. No. 9,041,206, issued on May 26, 2015, which applications are hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area.

As semiconductor technologies further advance, stacked semiconductor devices have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. Some commonly used bonding techniques for semiconductor wafers include direct bonding, chemically activated bonding, plasma activated bonding, anodic bonding, eutectic bonding, glass frit bonding, adhesive bonding, thermo-compressive bonding, reactive bonding and/or the like. After two semiconductor wafers are bonded together, the interface between two semiconductor wafers may provide an electrically conductive path between the stacked semiconductor wafers in some applications.

One advantageous feature of stacked semiconductor devices is that much higher density can be achieved by employing stacked semiconductor devices. Furthermore, stacked semiconductor devices can achieve smaller form factors, improved cost-effectiveness, increased performance, and lower power consumption.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to novel methods of forming conductive plugs between conductive features of semiconductor wafers that are bonded together, and structures thereof.

FIGS. 1A through 1F show cross-sectional views of a semiconductor device 100 at various stages of manufacturing in accordance with some embodiments of the present disclosure. Conductive plugs 120 (see FIG. 1F) are formed by patterning underlying material layers of the semiconductor device 100 using conductive features 106a as a hard mask material, using a method described in related patent application: Ser. No. 13/839,860, filed on Mar. 15, 2013, entitled, "Interconnect Structure and Method," which application is incorporated herein by reference.

Figure 1A:
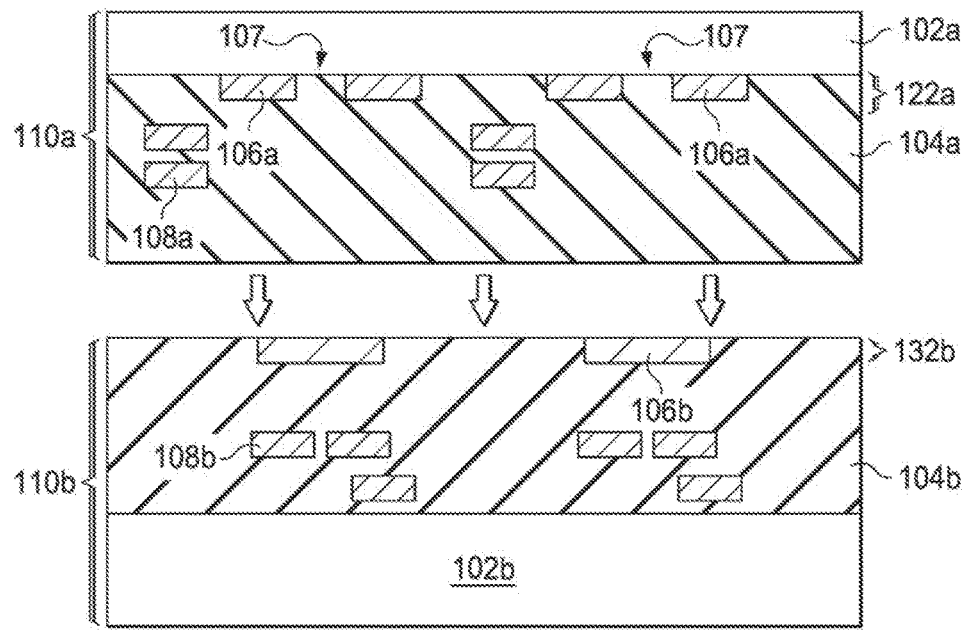
FIGS. 1A through 1F show cross-sectional views of semiconductor devices at various stages of manufacturing in accordance with some embodiments of the present disclosure.

Referring first to FIG. 1A, a cross-sectional view of a stacked semiconductor device prior to a bonding process is shown. A first semiconductor chip 110a is inverted and then bonded to a second semiconductor chip 110b in some embodiments. The first semiconductor chip 110a includes a first substrate 102a and a first conductive feature 106a formed over the first substrate 102a. The first conductive feature 106a is formed in a first inter-metal dielectric (IMD) 104a disposed over the first substrate 102a. The first conductive feature 106a is formed in a contact layer 122a of the first IMD 104a in some embodiments. The first conductive feature 106a comprises an opening 107 therein. The first semiconductor chip 110a may include a plurality of first conductive features 106a in some embodiments.

The second semiconductor chip 110b includes a second substrate 102b and a second conductive feature 106b formed over the second substrate 102b. The second conductive feature 106b is formed in a second IMD 104b disposed over the second substrate 102b. The first conductive feature 106a is formed in a redistribution layer (RDL) 132b of the second IMD 104b in some embodiments. The second semiconductor chip 110b may include a plurality of second conductive features 106b in some embodiments.

The first and second IMDs 104a and 104b of the first semiconductor chip 110a and the second semiconductor chip 110b, respectively, may include a plurality of conductive features such as conductive lines 108a and 108b and vias (not shown) formed in a plurality of insulating material layers of the first and second IMDs 104a and 104b using damascene or subtractive etch techniques, as examples.

The first and second substrates 102a and 102b of the first semiconductor chip 110a and the second semiconductor chip 110b, respectively, each comprise a workpiece which may include a semiconductor substrate comprising silicon or other semiconductor materials and may be covered by an insulating layer, for example. The workpieces may also include other active components or circuits, not shown. The workpieces may comprise silicon oxide over single-crystal silicon, for example. The workpieces may include other conductive layers or other semiconductor elements, e.g., transistors, diodes, etc. Compound semiconductors, GaAs, InP, Si/Ge, or SiC, as examples, may be used in place of silicon. The workpieces may comprise a silicon-on-insulator (SOI) or a germanium-on-insulator (GOI) substrate, as examples.

Figure 1B:
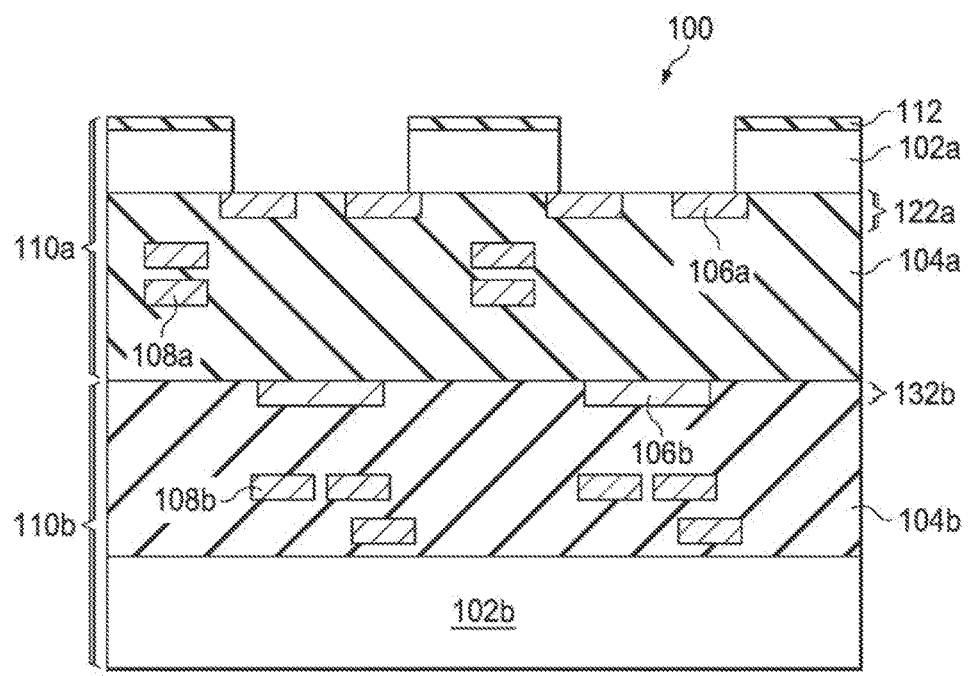

In FIG. 1B, there is shown a cross-sectional view of the semiconductor device 100 after the bonding process of the first and second semiconductor chips 110a and 110b in accordance with some embodiments. The semiconductor device 100 includes the first semiconductor chip 110a bonded to the second semiconductor chip 110b. In some embodiments, bonding pads are formed on or within the first semiconductor chip 110a and the second semiconductor chip 110b. The bonding pads of the second semiconductor chip 110b may be aligned face-to-face with their corresponding bonding pads of the first semiconductor chip 110a. The first semiconductor wafer 110 and the second semiconductor wafer 210 are bonded together through a suitable bonding technique such as direct bonding, which can be implemented using metal-to-metal bonding (e.g., copper-to-copper bonding), dielectric-to-dielectric bonding (e.g., oxide-to-oxide bonding), metal-to-dielectric bonding (e.g., oxide-to-copper bonding), a combination thereof and/or the like.

A bottom anti-reflection coating (B ARC) layer 112, also shown in FIG. 1B, is formed over the first semiconductor chip 110a and a patterning process is applied to the first substrate 102a of the first semiconductor chip 110a in accordance with some embodiments. The BARC layer 112 is formed on the backside of the first substrate 102a. The BARC layer 112 may be formed of a nitride material, an organic material, an oxide material and the like. The BARC layer 112 may be formed using suitable techniques such as chemical vapor deposition (CVD) and/or the like. The BARC layer 112 may have a thickness of about 200 Angstroms to about 6,000 Angstroms, as examples. Alternatively, the BARC layer 112 may comprise other materials, dimensions, and formation methods.

A patterned mask (not shown) such as a photoresist mask and/or the like may be formed over the BARC layer 112 using suitable deposition and photolithography techniques. A suitable etching process, such as a reactive ion etch (RIE) or other dry etch, an anisotropic wet etch, or any other suitable anisotropic etch or patterning process may be applied to the first substrate 102a of the first semiconductor chip 110a. As a result, a plurality of openings are formed in the BARC layer 112 and the first substrate 102a, as shown in FIG. 1B. The openings in the BARC layer 112 and the first substrate 102a are formed over first conductive features 106a. At least a portion of the first conductive features 106a are exposed through the openings in embodiments wherein the first conductive features 106a are disposed in a contact layer 122a. In other embodiments, such as the embodiments shown in FIG. 2 through 6, a portion of the first IMD 104a may be disposed between the openings in the first substrate 102a and the first conductive features 106a.

Figure 1C:
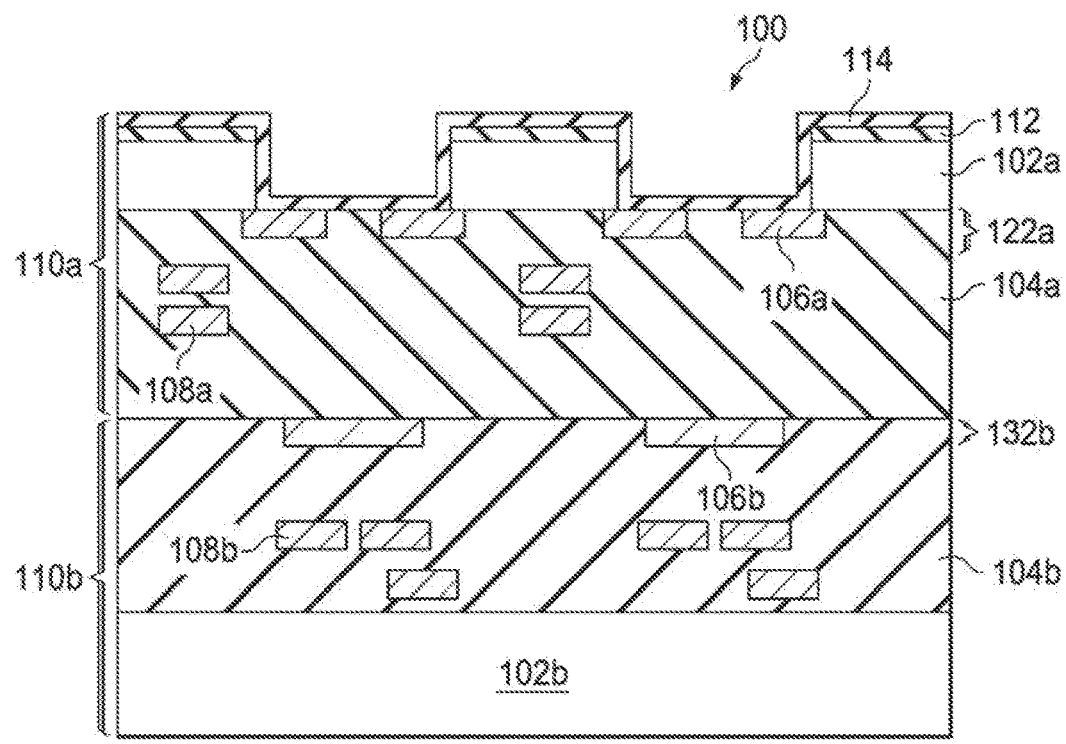

FIG. 1C illustrates a cross-sectional view of the semiconductor device 100 shown in FIG. 1B after a dielectric layer 114 is deposited over the semiconductor device 100 in accordance with some embodiments. The dielectric layer 114 is formed over the bottoms and sidewalls of the openings in the first substrate 102a and over the BARC layer 112. The dielectric layer 114 may be formed of various dielectric materials commonly used in integrated circuit fabrication. For example, the dielectric layer 114 may be formed of silicon dioxide, silicon nitride or a doped glass layer such as boron silicate glass and the like. Alternatively, dielectric layer 114 may be a layer of silicon nitride, a silicon oxynitride layer, a polyamide layer, a low dielectric constant insulator or the like. In addition, a combination of or multiple layers of the foregoing dielectric materials may also be used to form the dielectric layer 114. In accordance with some embodiments, the dielectric layer 114 may be formed using suitable techniques such as sputtering, oxidation, CVD and/or the like. The dielectric layer 114 may have a thickness of about 200 Angstroms to about 8,000 Angstroms, as examples. Alternatively, the dielectric layer 114 may comprise other materials, dimensions, and formation methods.

Figure 1D:
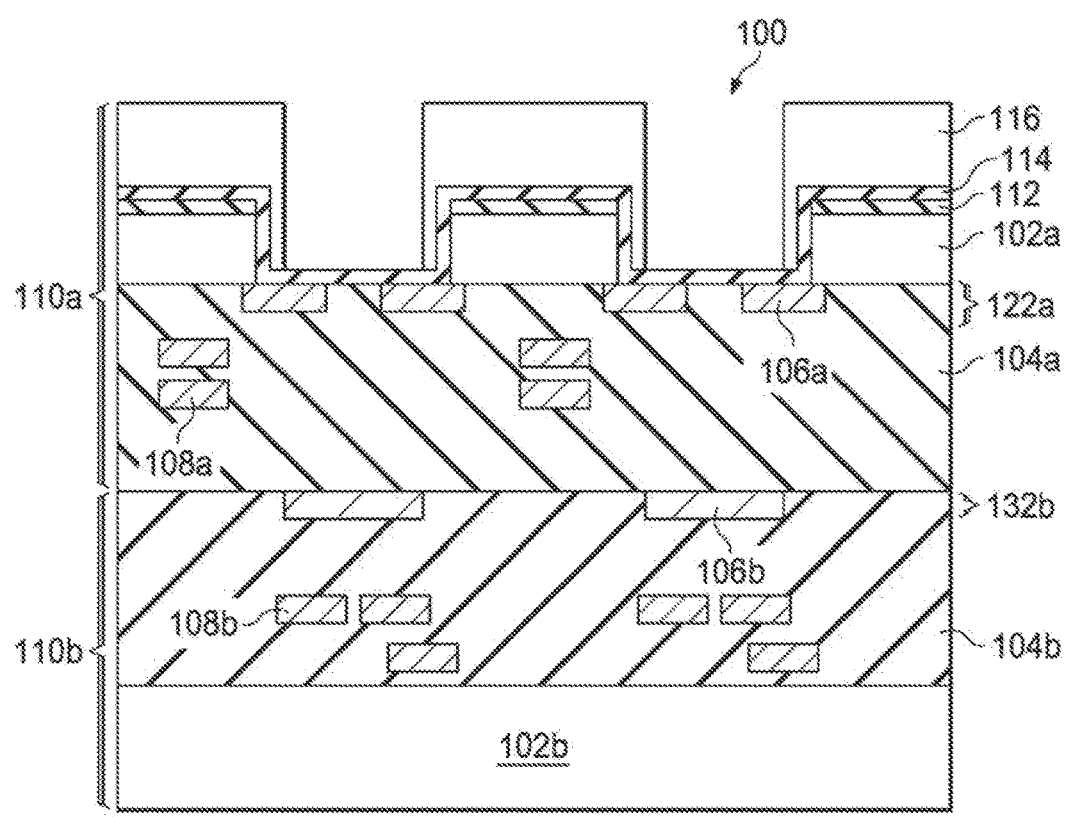

FIG. 1D illustrates a cross-sectional view of the semiconductor device 100 shown in FIG. 1C after a mask 116 is formed over the semiconductor device 100 in accordance with some embodiments. The patterned mask 116 is formed over the sidewalls of the openings in the first substrate 102a over the dielectric layer 114. For example, two new openings are formed after the patterned mask 116 is formed, along the sidewalls of the openings shown in FIG. 1C 116. The patterned mask 116 may be a photoresist layer or other photosensitive material which is patterned using a lithography process, as examples. The patterned mask 116 is formed on the top surface of the semiconductor device 100 using suitable deposition and photolithography techniques.

Figure 1E:
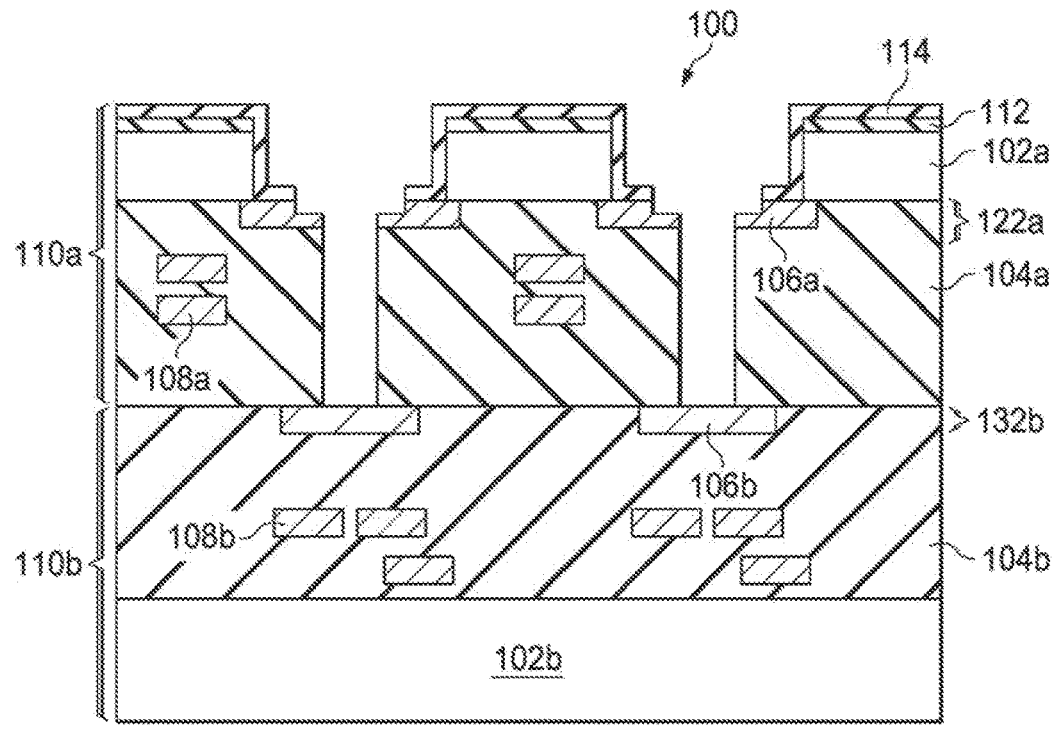

FIG. 1E illustrates a cross-sectional view of the semiconductor device 100 shown in FIG. 1D after an etching process is applied to the semiconductor device 100 in accordance with some embodiments. A suitable etching process, such as a dry etch, an anisotropic wet etch, or any other suitable anisotropic etch or patterning process, may be performed to form openings in the dielectric layer 114 and the first IMD 104a. The openings in the first IMD 104a are formed through the first conductive features 106a in the first IMD 104a using the first conductive features 106a as a hard mask, for example. The openings are respective extensions of the openings over the first conductive features 106a shown in FIGS. 1B, 1C, and 1D, for example. In particular, the openings extend through the first IMD 104a as well as the bonding interface of the two stacked semiconductor chips 110a and 110b. In embodiments wherein second conductive features 106b are formed in lower layers within the second IMD 104b (as shown in FIGS. 7 through 21), the openings also extend through portions of the second IMD 104b. As shown in FIG. 1E, portion of the first conductive features 106a and second conductive features 106b are exposed after the openings have been formed.

It should be noted that the first conductive features 106a and second conductive features 106b may be comprised of suitable metal materials such as copper in some embodiments, which has a different etching rate (selectivity) from the first substrate 102a and the insulating material layers of the first IMD 104a and the second IMD 104b. As such, the first conductive features 106a may function as a hard mask layer for the etching process of the first IMD 104a and the second IMD 104b. A selective etching process may be employed to etch the first IMD 104a and the second IMD 104b rapidly while etching only a portion of or a negligible amount of the first conductive features 106a. As shown in FIG. 1E, the exposed portion of the hard mask layer (e.g., first conductive features 106a) is partially etched away in some embodiments, thereby forming a recess in the top surfaces of the first conductive features 106a. The depth of the recess may vary depending on different applications and design needs. In other embodiments, a recess may not be formed in the first conductive features 106a, not shown.

The remaining mask 116 (see FIG. 1D) is removed, also shown in FIG. 1E, using suitable photoresist stripping techniques such as chemical solvent cleaning, plasma ashing, dry stripping and/or the like.

Figure 1F:
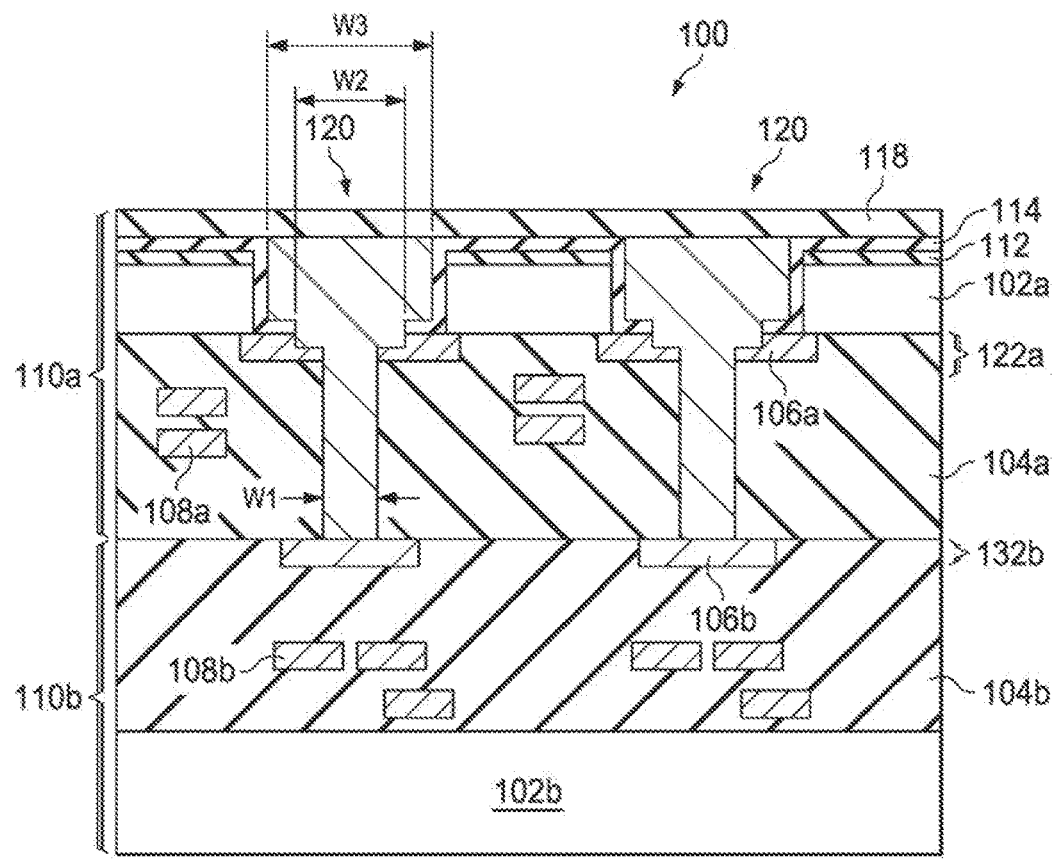

Referring next to FIG. 1F, a conductive material is filled in the openings in accordance with various embodiments of the present disclosure. In some embodiments, a barrier layer and/or a seed layer (not shown) may be deposited prior to a plating process, through which the conductive material is filled into the openings, e.g., using an electroplating process. The conductive material may alternatively be formed using a deposition process or other methods. A chemical mechanical polish (CMP) process and/or an etch process is applied to the top surface of the semiconductor device 100 to remove excess portions of the conductive material from the top surface of the semiconductor device 100 (e.g., over the dielectric layer 114), leaving conductive plugs 120 comprised of the conductive material formed within the openings, as shown in FIG. 1E.

Each conductive plug 120 may comprise three portions in some embodiments. A first portion extends from the second conductive features 106b to the hard mask layer formed by the first conductive features 106a. The first portion is of a width W1, as shown in FIG. 1F. A second portion extends from the hard mask layer towards the front side of the first substrate 102a, e.g., where the first substrate 102a abuts the first IMD 104a. The second portion is of a width W2. A third portion extends from the front side of the first substrate 102a to the back side of the first substrate 102a, e.g., proximate the BARC layer 112 and the dielectric layer 114. The third portion is of a width W3. In some embodiments, W2 is greater than or substantially equal to W1, and W3 is greater than W2. The various portions of the conductive plugs 120 are referred to herein as first, second, and/or third portions depending on the order of their introduction in various portions of the specification and also in the claims, for example. For example, if the third portion of the conductive plugs 120 comprising width W3 is mentioned first, it is referred to as a first portion, and if the first portion of the conductive plugs 120 comprising width W1 is mentioned second, it is referred to as a second portion, in other paragraphs of the specification and in the claims.

In embodiments wherein a top portion of the first conductive features 106a is removed during the etch process described for FIG. 1E, the second portion of the conductive plugs 120 having width W2 is partially formed within the first conductive features 106a, as shown in FIG. 1F. The second portion of the conductive plugs 120 having width W2 is also formed in the opening in the dielectric layer 114 above the first conductive features 106a. Alternatively, in embodiments wherein a top portion of the first conductive features 106a is not removed (not shown), the second portion of the conductive plugs 120 having width W2 is only formed in the opening in the dielectric layer 114 above the first conductive features 106a, as another example.

After the conductive plug 120 formation, a dielectric layer 118 is formed on the semiconductor device 100 in accordance with some embodiments of the present disclosure, also shown in FIG. 1F. The dielectric layer 118 may comprise commonly used dielectric materials, such as silicon nitride, silicon oxynitride, silicon oxycarbide, silicon carbide, combinations thereof, and/or multiple layers thereof. The dielectric layer 118 may be deposited over the semiconductor device using suitable deposition techniques such as sputtering, CVD, and the like. The dielectric layer 118 may comprise a thickness on the order of about a few hundreds or thousands of Angstroms, as examples. Alternatively, the dielectric layer 118 may comprise other materials, dimensions, and formation methods. In some embodiments, the dielectric layer 118 is not included.

An advantageous feature of the semiconductor device 100 comprising the stacked wafers having the conductive plugs 120 shown in FIG. 1F is that active circuits of both semiconductor chips 110a and 110b can be connected to each other through the conductive plugs 120, which reduces form factor, reduces power consumption, and prevents parasitic interference of the semiconductor device 100 in some applications.

In some embodiments, the semiconductor device 100 includes a conductive plug 120 that is coupled between the first conductive feature 106a and the second conductive feature 106b. The conductive plug 120 is disposed through the first conductive feature 106a and is coupled to the second conductive feature 106b in some embodiments. For example, the conductive plug 120 passes through the first conductive feature 106a and ends at the second conductive feature 106b, in some embodiments.

In some embodiments, the conductive plug 120 includes a first portion disposed over the first conductive feature 106a, the first portion comprising a first width comprising dimension W3. The conductive plug 120 includes a second portion disposed beneath or within the first conductive feature 106a, the second portion comprising a second width comprising dimension W1. The first width comprising dimension W3 is greater than the second width comprising dimension W1. The first portion of the conductive plug 120 having the first width comprising dimension W3 is disposed within the first substrate 102a of the first semiconductor chip 110a in some embodiments. In some embodiments, the conductive plug 120 further comprises a third portion disposed between the first portion having the first width comprising dimension W3 and the first conductive feature 106a. The third portion of the conductive plugs 120 has a third width comprising a dimension W2, wherein the third width comprising dimension W2 is greater than the second width of the conductive plugs 120 comprising dimension W1, and wherein the third width comprising dimension W2 is less than the first width of the conductive plugs 120 comprising dimension W3.

Two conductive plugs 120 are shown in the figures; however, only one conductive plug 120 may be formed, or a plurality of conductive plugs 120 (e.g., three or more) may be formed within the semiconductor device 100. The conductive plugs 120 form vertical connections for the semiconductor device 100 between the first conductive features 106a and the second conductive features 106b. Likewise, only two semiconductor chips 110a and 110b are shown; alternatively, three or more semiconductor chips may be bonded together and connected together using conductive plugs 120 in accordance with some embodiments of the present disclosure.

The first conductive feature 106a comprises a hard mask for a formation of the second portion of the conductive plug 120 which has the second width comprising dimension W1 some embodiments. The first conductive feature 106a comprises an opening therein, and the second portion of the conductive plug 120 having the second width comprising dimension W1 is disposed beneath the opening in the first conductive feature 106a in some embodiments. The first conductive feature 106a comprises a circular, oval, square, rectangular, or other shape in a top view in some embodiments, as described in the related patent application.

In accordance with some embodiments of the present disclosure, the first conductive feature 106a, the second conductive feature 106b, and the conductive plugs 120 comprise a conductive material such as W, Cu, AlCu, polysilicon, other conductive materials, or combinations or multiple layers thereof, as examples. Alternatively, the first conductive feature 106a, the second conductive feature 106b, and the conductive plugs 120 may comprise other materials.

In some embodiments, a portion of the conductive plugs 120 is disposed within the first conductive feature 106a or the second conductive feature 106b. For example, in FIG. 1F, a portion of the conductive plugs 120 is disposed within and passes through the first conductive features 106a, within an opening (see opening 107 in FIG. 1A) in each of the first conductive features 106a. In some embodiments, during the etch process for the conductive plugs 120, a top portion of the second conductive feature 106b is removed, and the conductive material of the conductive plug 120 fills the top portion of the second conductive feature 106b, so that a portion of the conductive plugs 120 is coupled to and disposed within the second conductive feature 106b (not shown in the figures).

In the embodiment shown in FIGS. 1A through 1F, the first conductive feature 106a is formed in a contact layer 122a of the first semiconductor chip 110a, and the second conductive feature 106b is formed in a redistribution layer (RDL) 132b of the second semiconductor chip 110b. The conductive plugs 120 provide an electrical link from the contact layer 122a of the first semiconductor chip 110a to the RDL 132b of the second semiconductor chip 110b. However, in accordance with some embodiments of the present disclosure, the first conductive feature 106a and the second conductive feature 106b may be formed in any of the other conductive material layers of the first and second IMDs 104a and 104b of the first semiconductor chip 110a and the second semiconductor chip 110b, respectively, to be described further herein.

Figure 2:
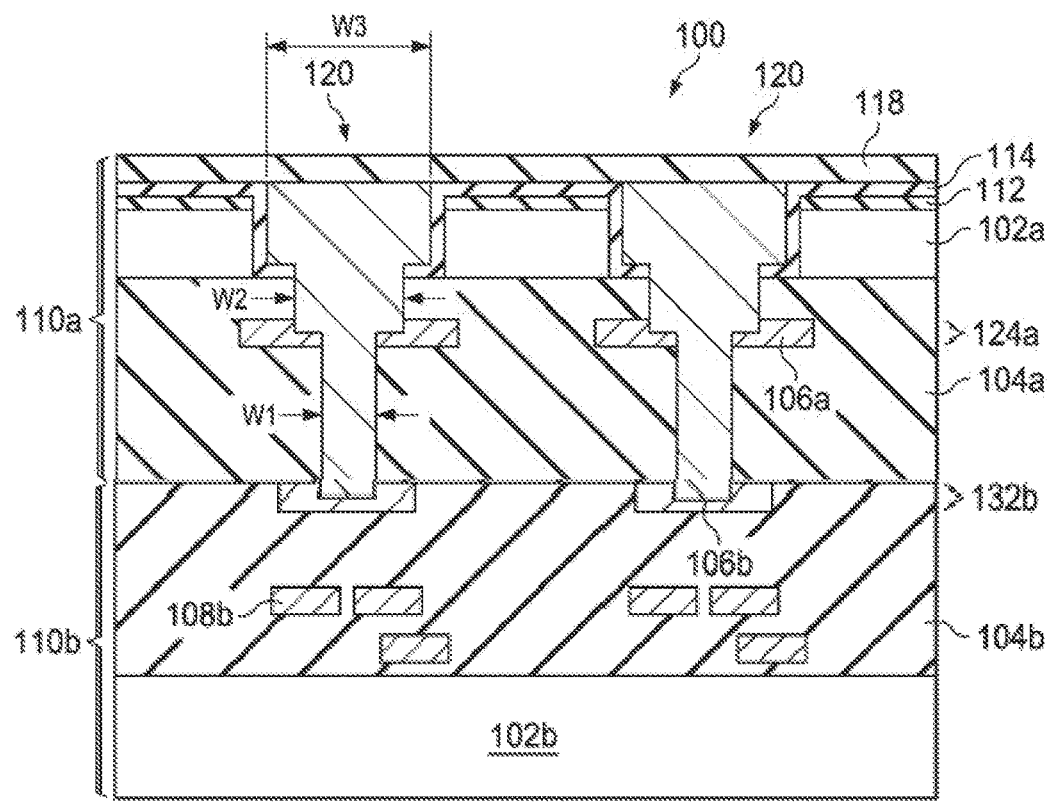
FIGS. 2, 3, 4, 5, 6, and 6A illustrate cross-sectional views of semiconductor devices in accordance with some embodiments.

FIGS. 2 through 6 illustrate cross-sectional views of semiconductor devices 100 in accordance with some embodiments. FIG. 2 illustrates an embodiment wherein the first conductive features 106a are formed in a bottom conductive line layer 124a or M1 layer of the first semiconductor chip 110a, and the second conductive features 106b are formed in an RDL 132b of the second semiconductor chip 110b. Note that because the first semiconductor chip 110a was inverted before the bonding process, the bottom conductive line layer 124a appears proximate the upper portion of the first IMD 104a in the view shown. The bottom conductive line layer 124a comprises a bottom metallization layer of the first semiconductor chip 110b in some embodiments, for example. The conductive plugs 120 comprise three portions having widths comprising dimensions W1, W2, and W3. Because the first conductive features 106a are formed in a layer beneath a surface of the IMD 104a proximate the first substrate 102a, a portion of the conductive plugs 120 comprising dimension W2 is also formed within the first IMD 102a, e.g., above the first conductive features 106a.

Figure 3:
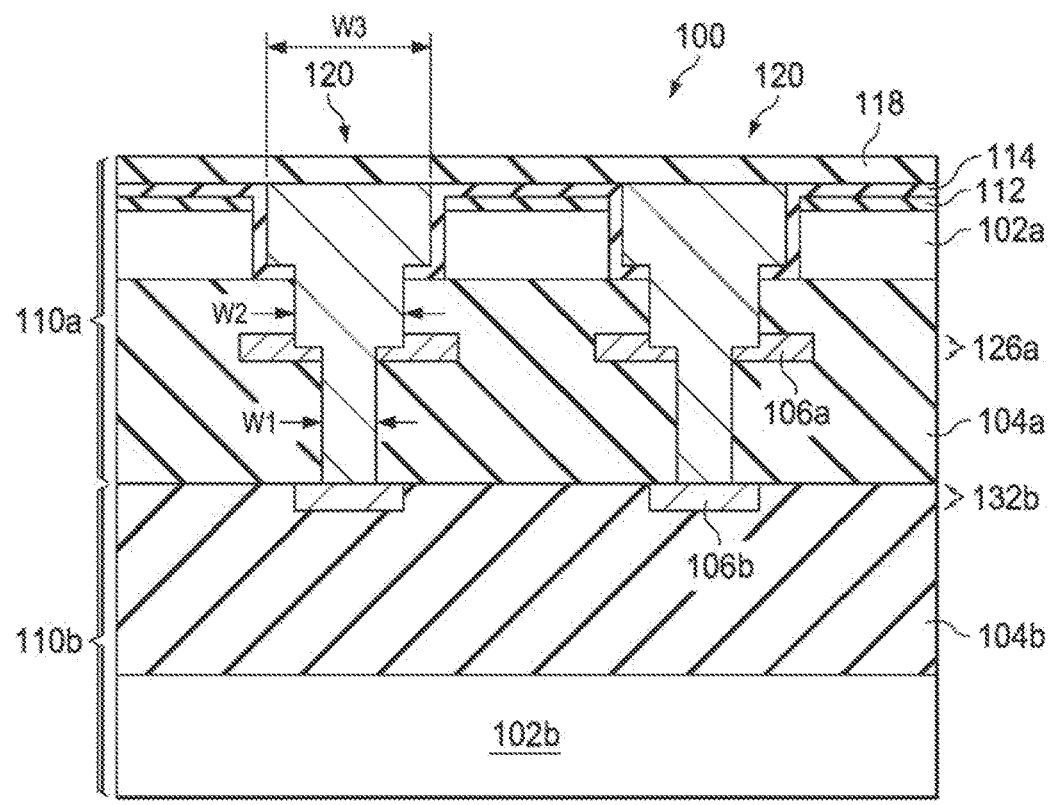

FIG. 3 illustrates an embodiment wherein the first conductive features 106a are formed in a conductive line layer 126a or M2 layer of the first semiconductor chip 110a, and the second conductive features 106b are formed in an RDL 132b of the second semiconductor chip 110b. The conductive line layer 126a comprises a metallization layer disposed between a bottom metallization layer and a top metallization layer of the first semiconductor chip 110a in some embodiments, for example. The conductive plugs 120 comprise three portions having widths comprising dimensions W1, W2, and W3.

Figure 4:
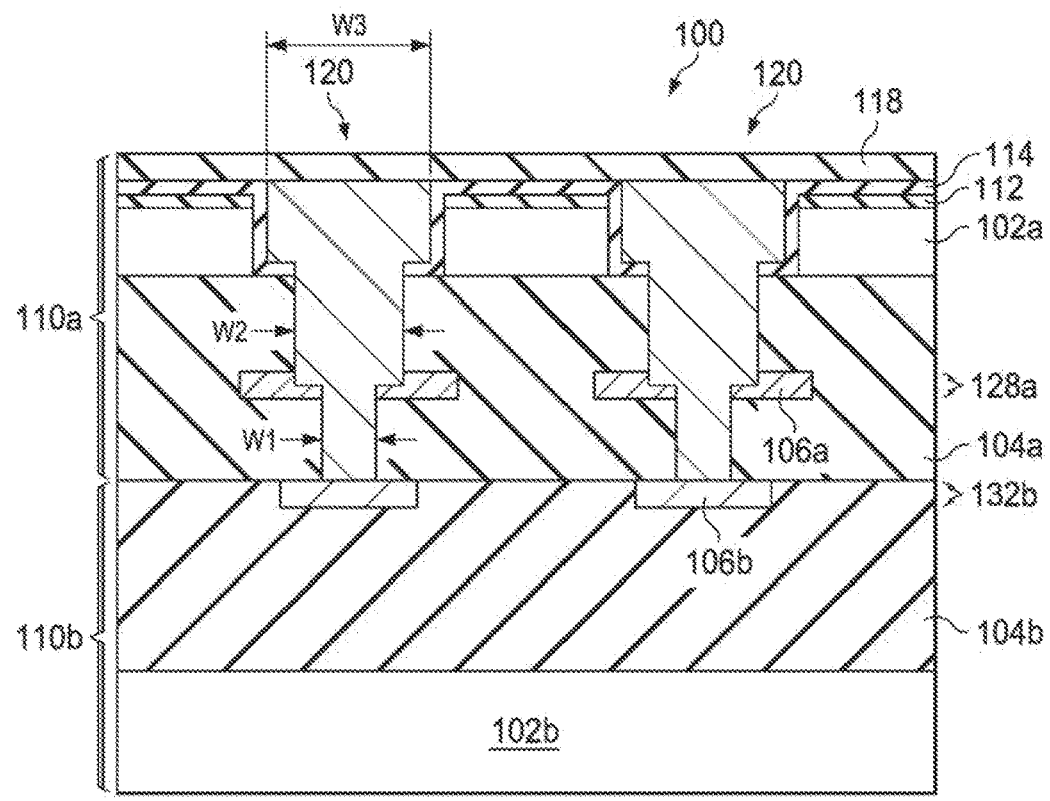

FIG. 4 illustrates an embodiment wherein the first conductive features 106a are formed in a conductive line layer 128a or Mx layer of the first semiconductor chip 110a, and the second conductive features 106b are formed in an RDL 132b of the second semiconductor chip 110b. The conductive line layer 128a comprises an upper metallization layer disposed between a bottom metallization layer and a top metallization layer of the first semiconductor chip 110a in some embodiments, for example. The conductive plugs 120 comprise three portions having widths comprising dimensions W1, W2, and W3.

Figure 5:
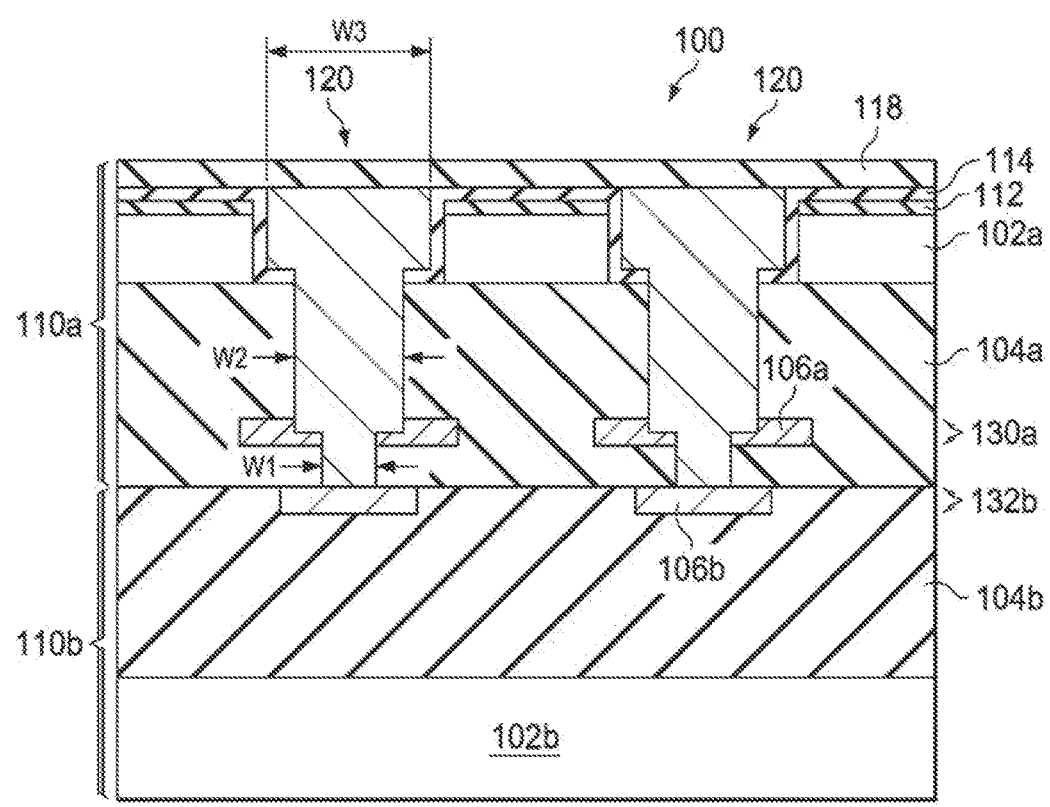

FIG. 5 illustrates an embodiment wherein the first conductive features 106a are formed in a top conductive line layer 130a of the first semiconductor chip 110a, and the second conductive features 106b are formed in an RDL 132b of the second semiconductor chip 110b. The top conductive line layer 130a comprises a top metallization layer of the first semiconductor chip 110a in some embodiments, for example. Features in the top conductive line layer 130a may be wider and thicker than features in an Mx layer described in FIG. 4 in some embodiments, for example. In other embodiments, features in the top conductive line layer 130a may not be wider or thicker than features in an Mx layer. The conductive plugs 120 comprise three portions having widths comprising dimensions W1, W2, and W3.

Figure 6:
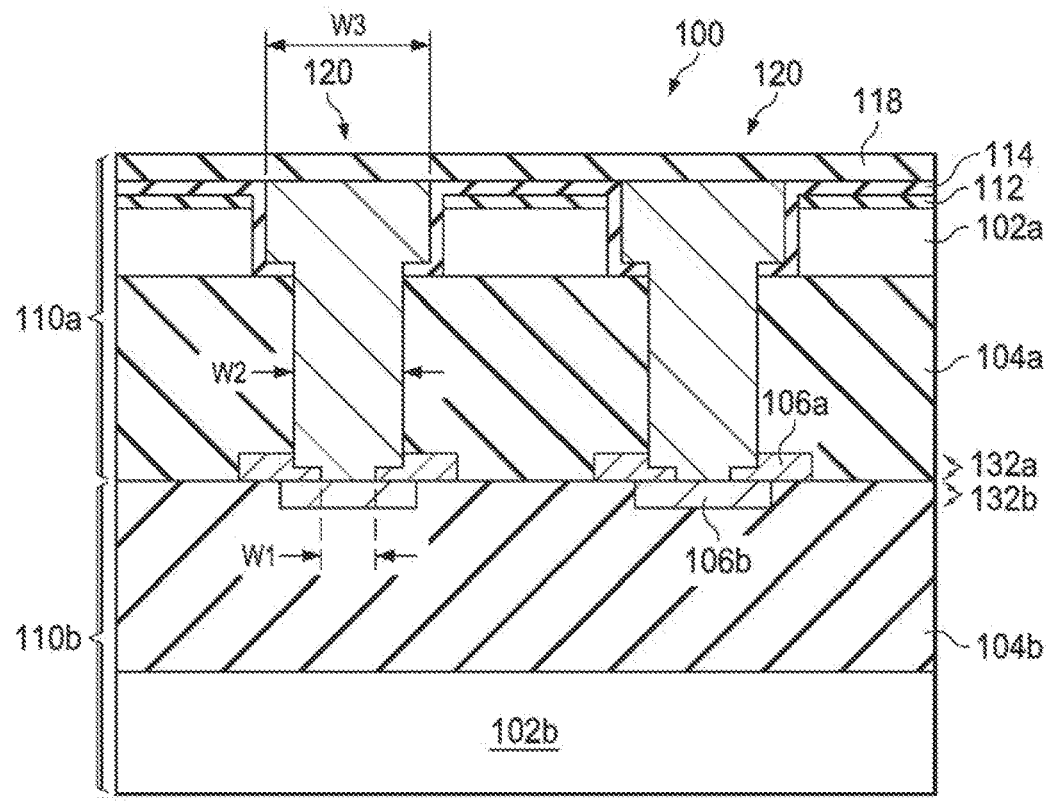
Figure 6A:
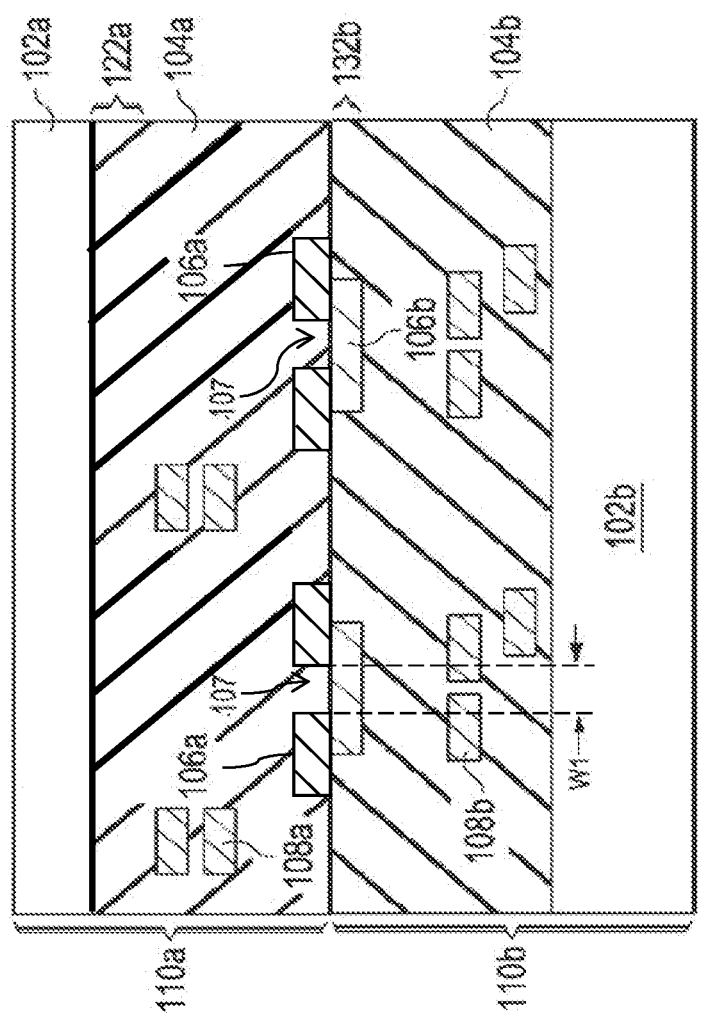

FIGS. 6 and 6A illustrate an embodiment wherein the first conductive features 106a are formed in an RDL 132a of the first semiconductor chip 110a, and the second conductive features 106b are formed in an RDL 132b of the second semiconductor chip 110b. The RDL 132a is disposed proximate a surface of the IMD 104a of the first semiconductor chip 110a in some embodiments, for example. FIG. 6A illustrates the first semiconductor chip 106a and the second semiconductor chip 106b prior to forming the conductive plugs 120, and FIG. 6 illustrates the first semiconductor chip 106a and the second semiconductor chip 106b after forming the conductive plugs 120. The conductive plugs 120 comprise three portions having widths comprising dimensions W1, W2, and W3. A portion of the conductive plugs 120 disposed within the first conductive feature 106a has a width comprising dimension W1. A portion of the conductive plugs 120 disposed within the IMD 104a of the first semiconductor chip 110a and within the opening in the dielectric layer 114 comprises a width comprising dimension W2. A portion of the conductive plugs 120 disposed within the first substrate 102a of the first semiconductor chip 110a has a width comprising dimension W3.

In the embodiments shown in FIGS. 1 through 6, the second conductive features 106b are formed in an RDL 132b of the second semiconductor chip 110b. The conductive plugs 120 provide an electrical link from the various conductive material layers, e.g., layers 122a, 124a, 126a, 128a, 130a, and 132a of the first semiconductor chip 110a to the RDL 132b of the second semiconductor chip 110b. In other embodiments, the second conductive features 106b are formed in other conductive material layers of the IMD 104b of the second semiconductor chip 110b.

Figure 7:
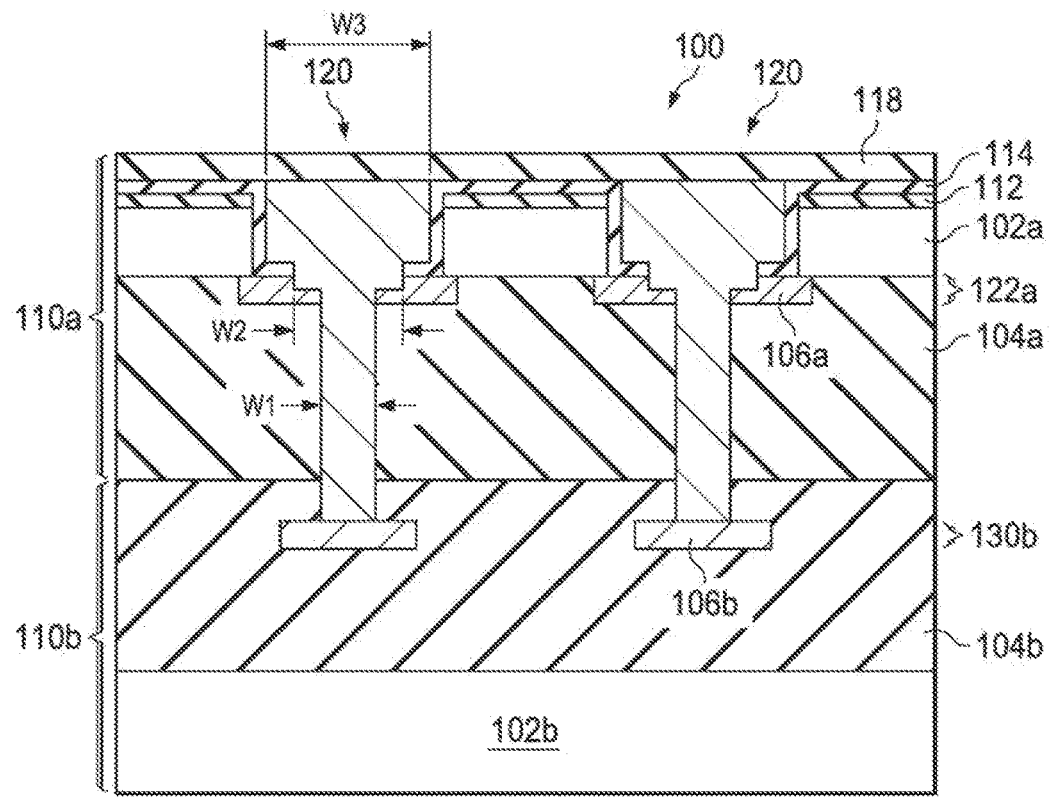
FIGS. 7 through 9 illustrate cross-sectional views of semiconductor devices in accordance with other embodiments.
Figure 8:
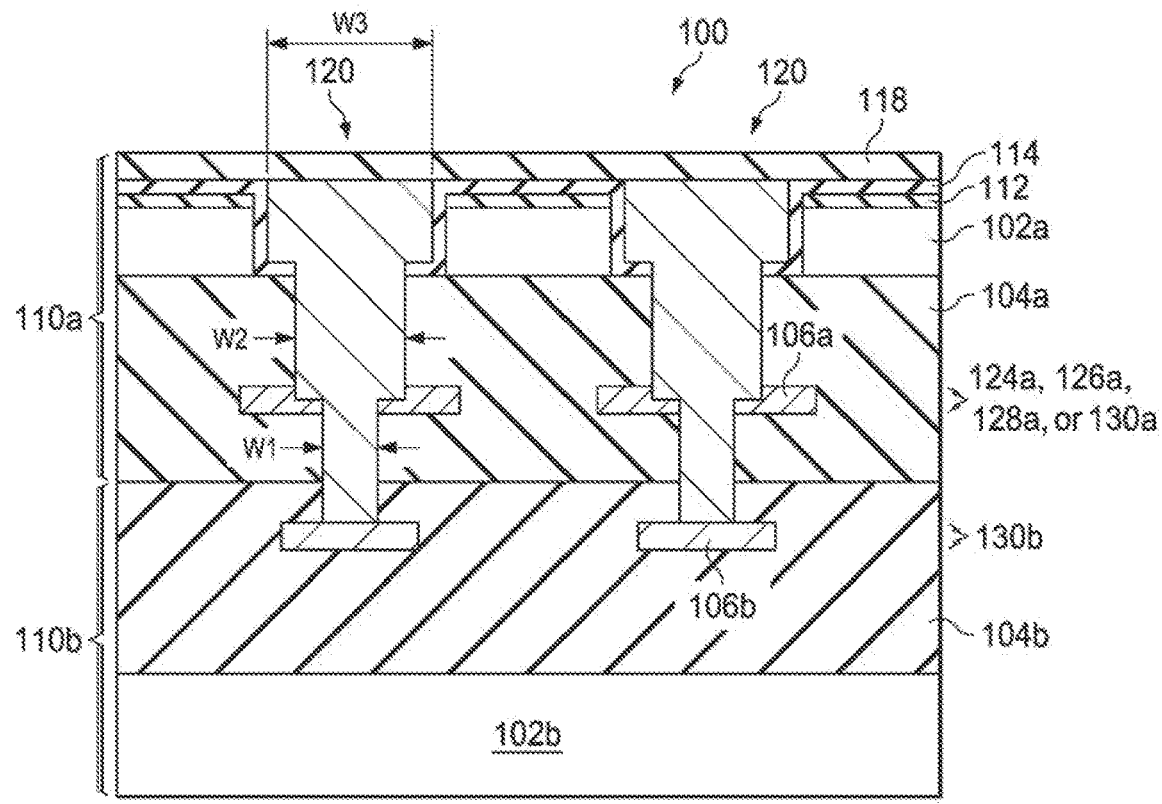
Figure 9:
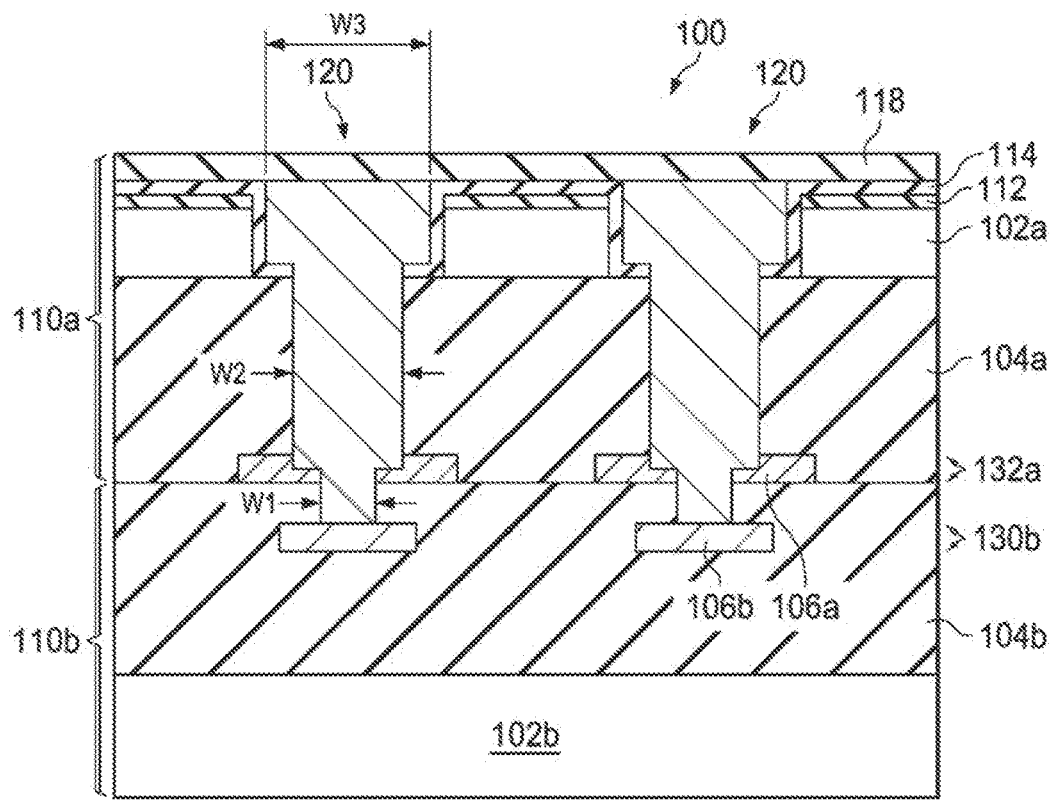

For example, FIGS. 7 through 9 illustrate cross-sectional views of semiconductor devices 100 in accordance with other embodiments. In FIG. 7, the first conductive features 106a are formed in a contact layer 122a of the first semiconductor chip 110a, and the second conductive features 106b are formed in a top conductive line layer 130b of the second semiconductor chip 110b. In FIG. 8, the first conductive features 106a are formed in a conductive line layer 124a, 126a, 128a, or 130a of the first semiconductor chip 110a, and the second conductive features 106b are formed in a top conductive line layer 130b of the second semiconductor chip 110b. In FIG. 9, the first conductive features 106a are formed in an RDL 132a of the first semiconductor chip 110a, and the second conductive features 106b are formed in a top conductive line layer 130b of the second semiconductor chip 110b. The conductive plugs 120 provide an electrical link from the various conductive material layers 122a, 124a, 126a, 128a, 130a, and 132a of the first semiconductor chip 110a to the top conductive line layer 130b of the second semiconductor chip 110b. A portion of the conductive plugs 120 having a width comprising dimension W1 extends through the first conductive features 106a into the IMD 104b of the second semiconductor chip 110b to connect to the second conductive features 106b.

Figure 10:
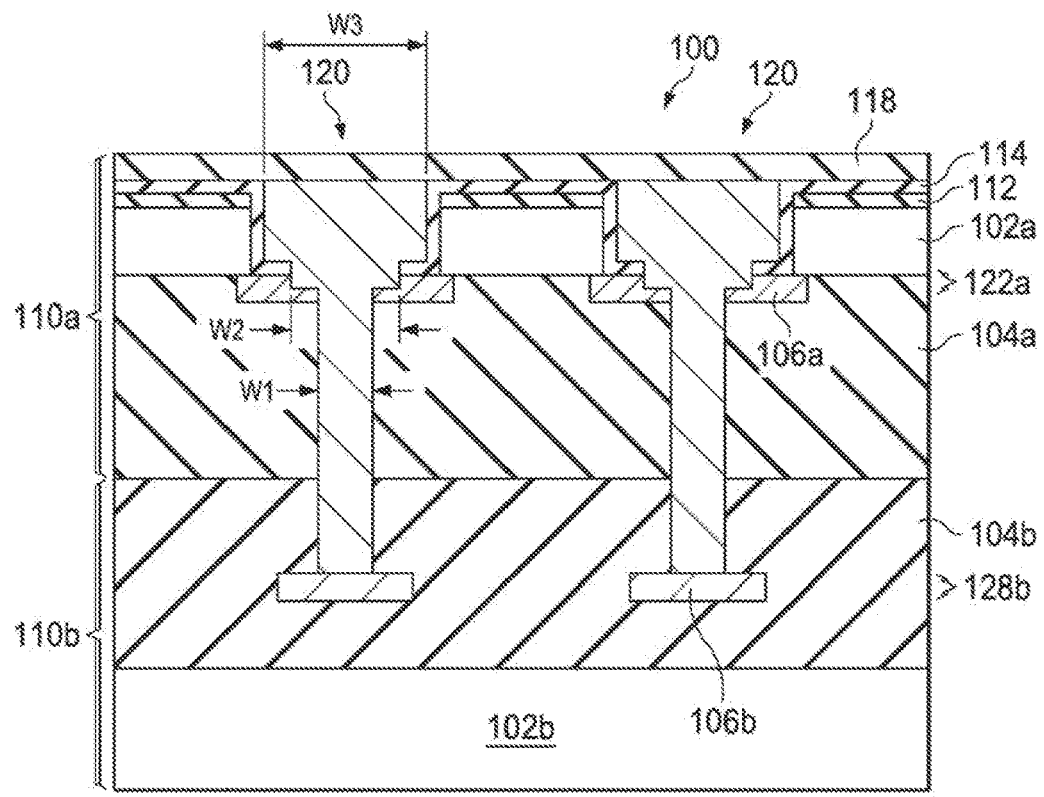
FIGS. 10 through 12 illustrate cross-sectional views of semiconductor devices in accordance with other embodiments.
Figure 11:
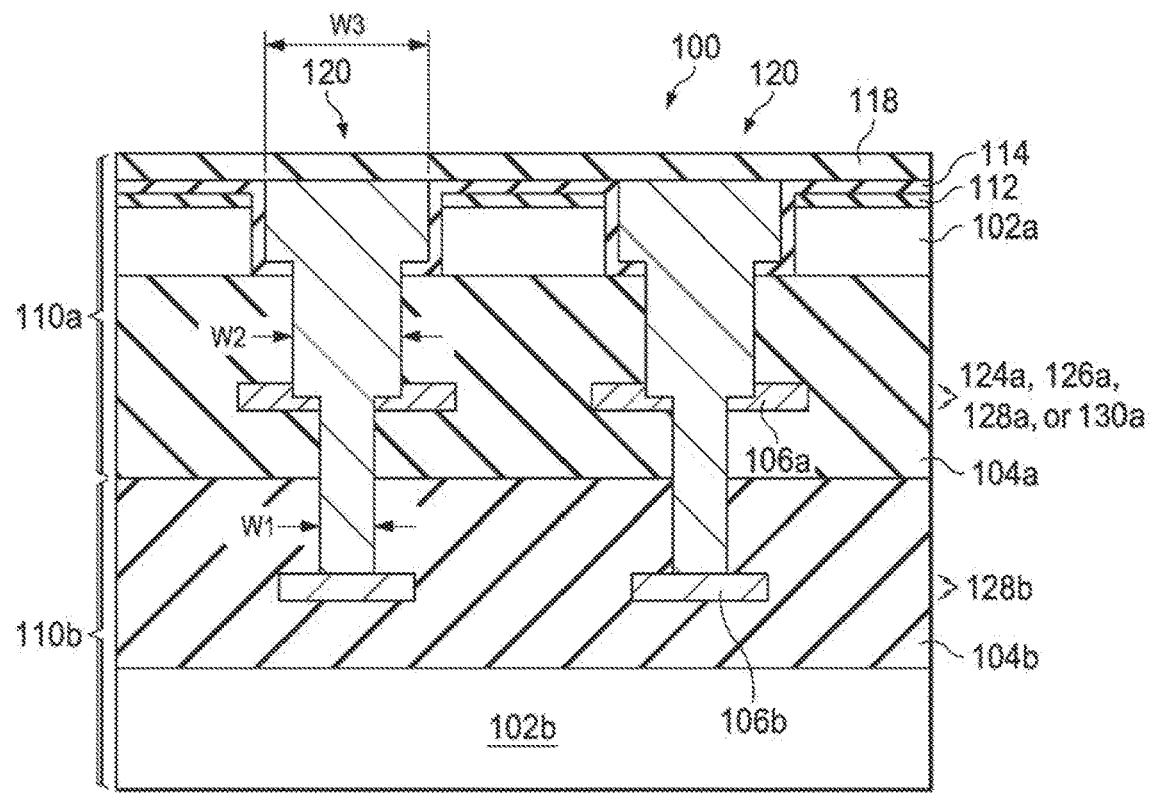
Figure 12:
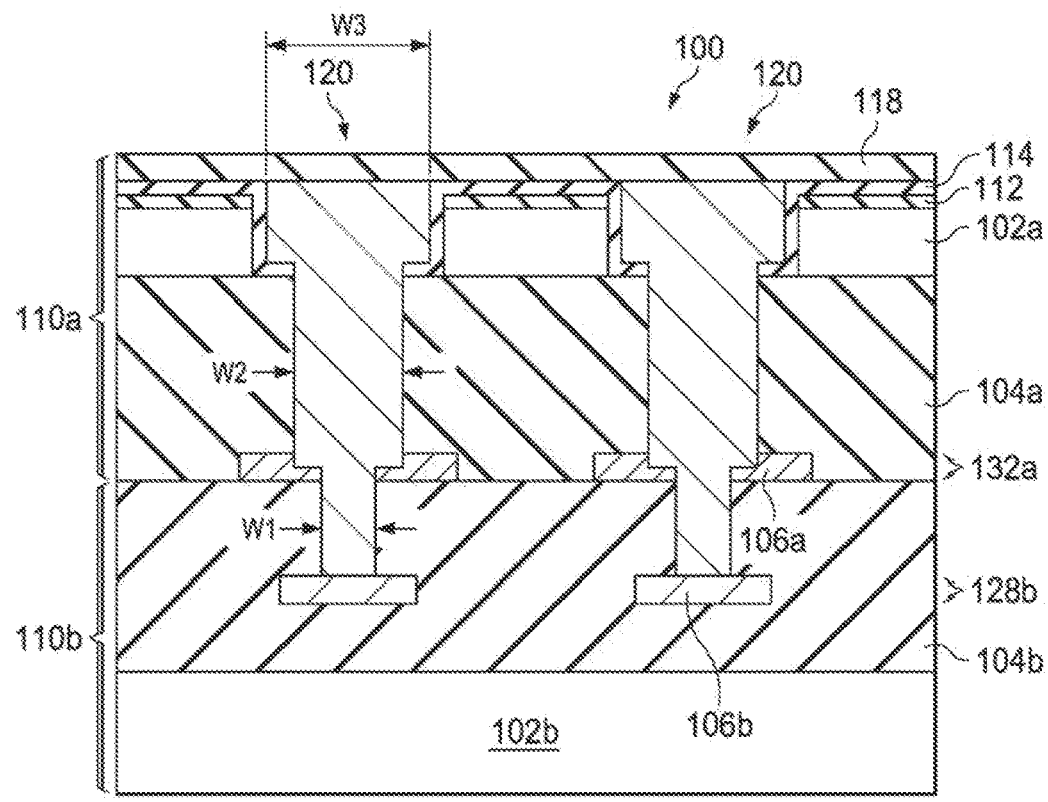

FIGS. 10 through 12 illustrate cross-sectional views of semiconductor devices 100 in accordance with other embodiments, wherein the second conductive features 106b are formed in a conductive line layer 128b or Mx layer of the second semiconductor chip 110b. In FIG. 10, the first conductive features 106a are formed in a contact layer 122a of the first semiconductor chip 110a. In FIG. 11, the first conductive features 106a are formed in a conductive line layer 124a, 126a, 128a, or 130a of the first semiconductor chip 110a. In FIG. 12, the first conductive features 106a are formed in an RDL 132a of the first semiconductor chip 110a. The conductive plugs 120 provide an electrical link from the various conductive material layers 122a, 124a, 126a, 128a, 130a, and 132a of the first semiconductor chip 110a to the conductive line layer 128b or Mx layer of the second semiconductor chip 110b. A portion of the conductive plugs 120 having a width comprising dimension W1 extends through the first conductive features 106a into the IMD 104b of the second semiconductor chip 110b to connect to the second conductive features 106b.

Figure 13:
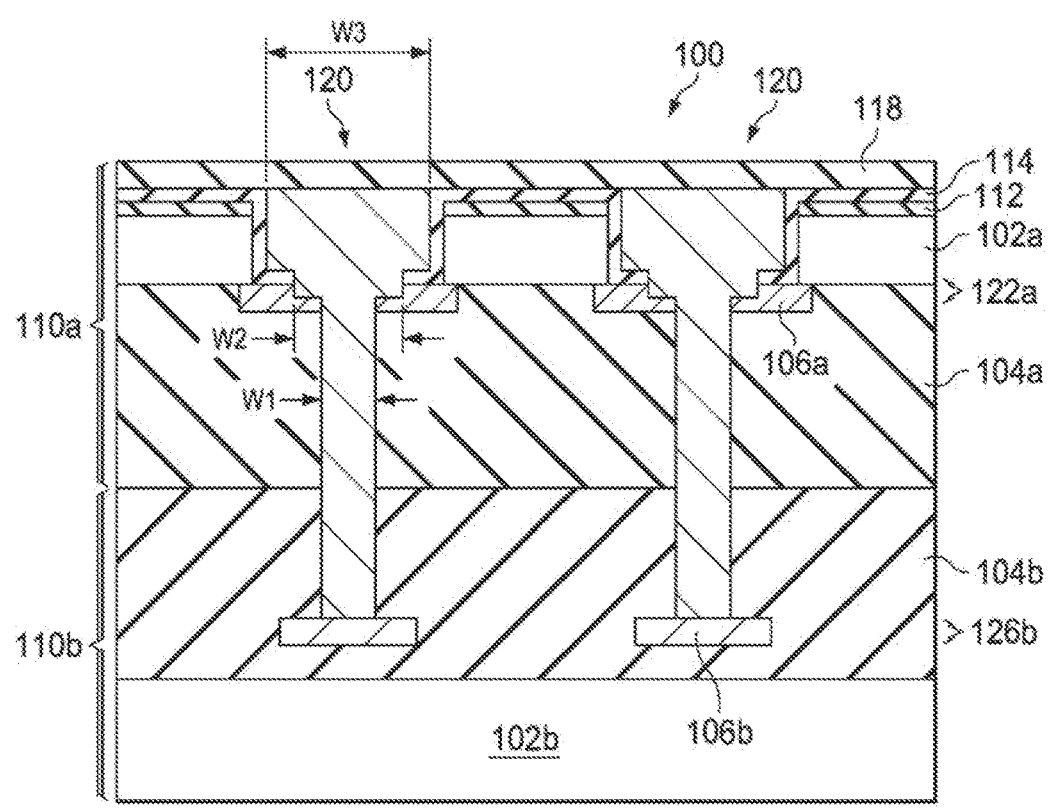
FIGS. 13 through 15 illustrate cross-sectional views of semiconductor devices in accordance with other embodiments.
Figure 14:
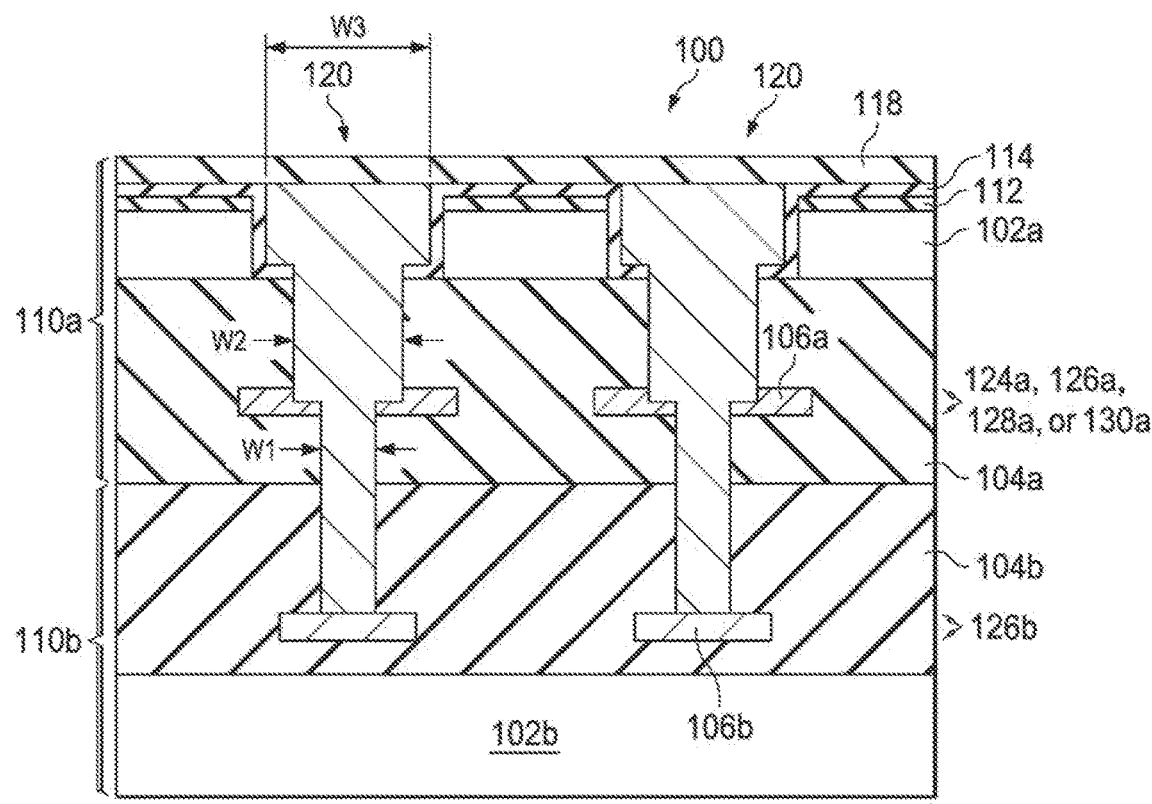
Figure 15:
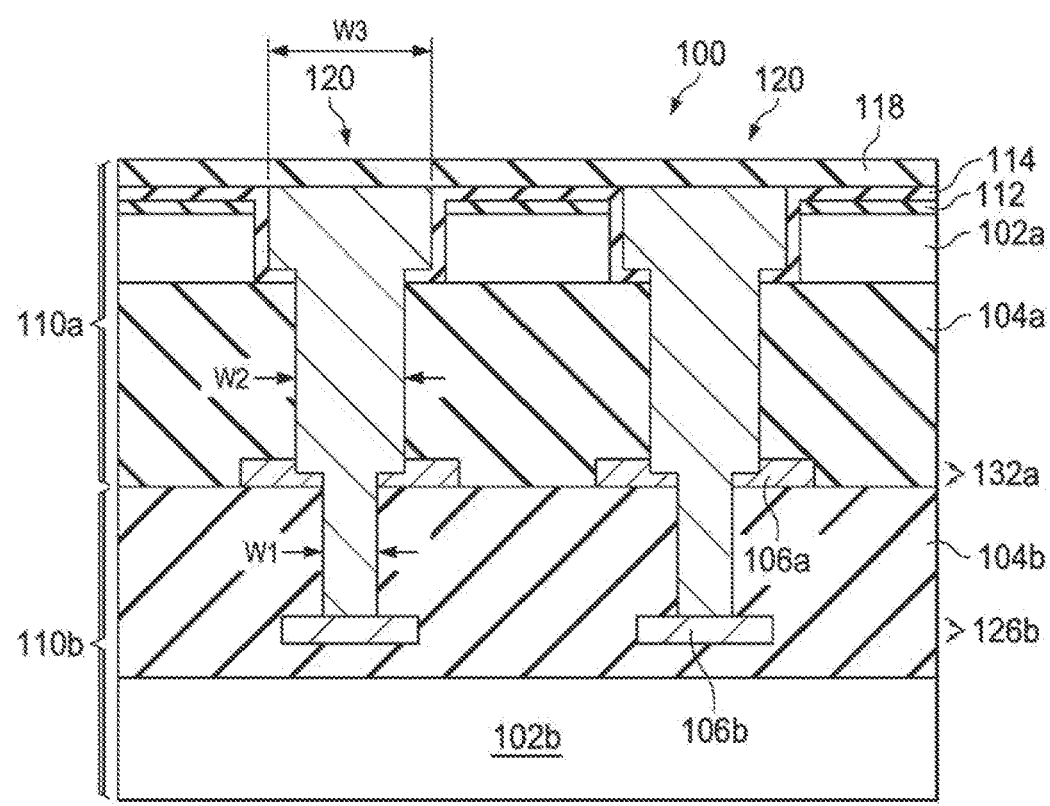

FIGS. 13 through 15 illustrate cross-sectional views of semiconductor devices 100 in accordance with other embodiments, wherein the second conductive features 106b are formed in a conductive line layer 126b or M2 layer of the second semiconductor chip 110b. In FIG. 13, the first conductive features 106a are formed in a contact layer 122a of the first semiconductor chip 110a. In FIG. 14, the first conductive features 106a are formed in a conductive line layer 124a, 126a, 128a, or 130a of the first semiconductor chip 110a. In FIG. 15, the first conductive features 106a are formed in an RDL 132a of the first semiconductor chip 110a. The conductive plugs 120 provide an electrical link from the various conductive material layers 122a, 124a, 126a, 128a, 130a, and 132a of the first semiconductor chip 110a to the conductive line layer 126b or M2 layer of the second semiconductor chip 110b. A portion of the conductive plugs 120 having a width comprising dimension W1 extends through the first conductive features 106a into the IMD 104b of the second semiconductor chip 110b to connect to the second conductive features 106b.

Figure 16:
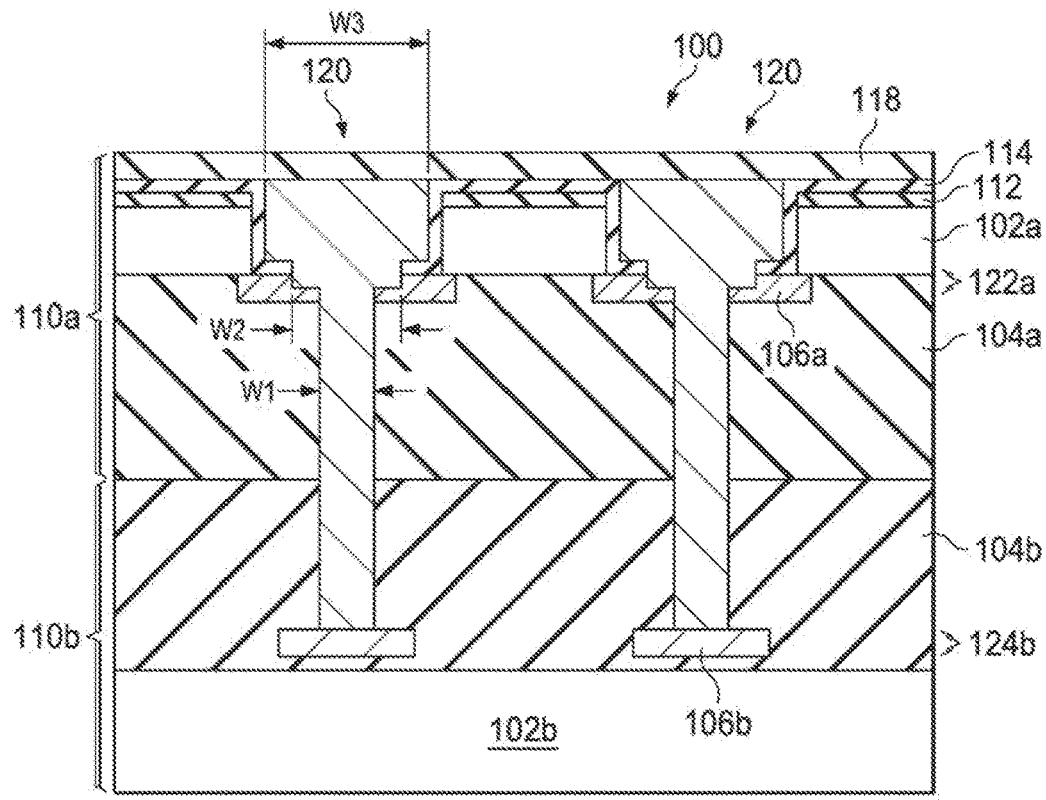
FIGS. 16 through 18 illustrate cross-sectional views of semiconductor devices in accordance with other embodiments.
Figure 17:
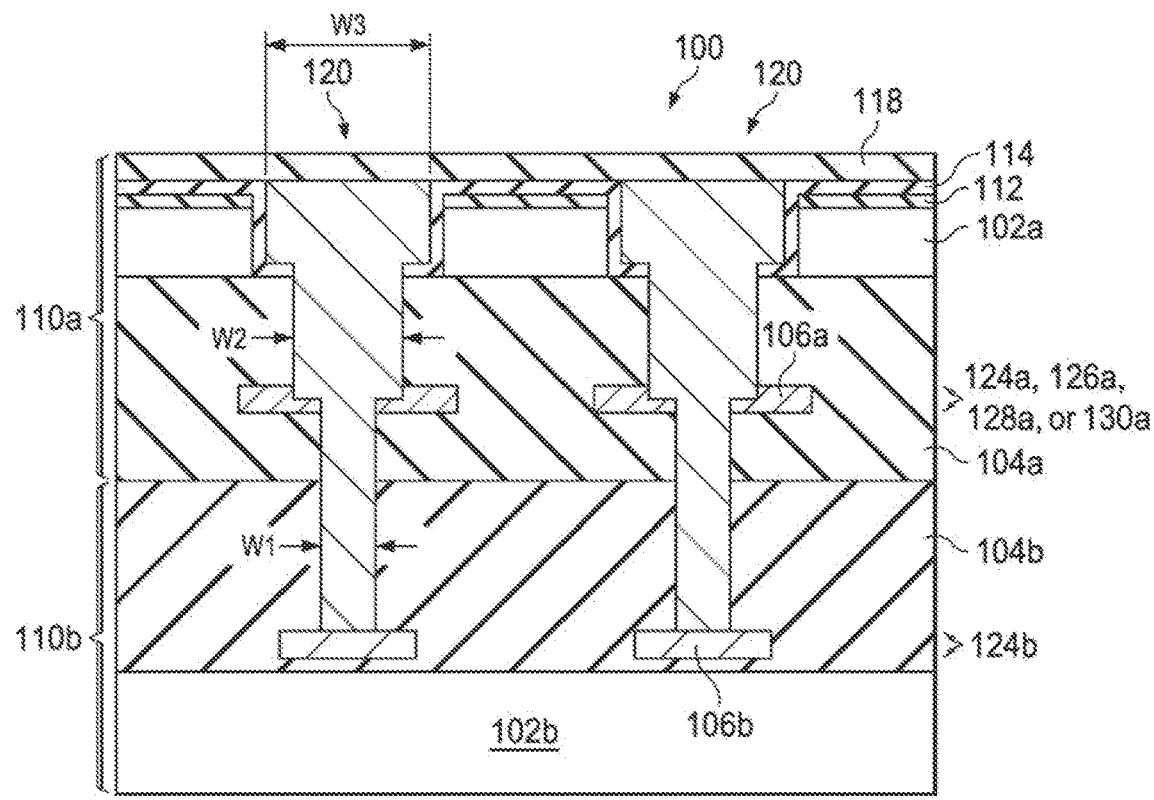
Figure 18:
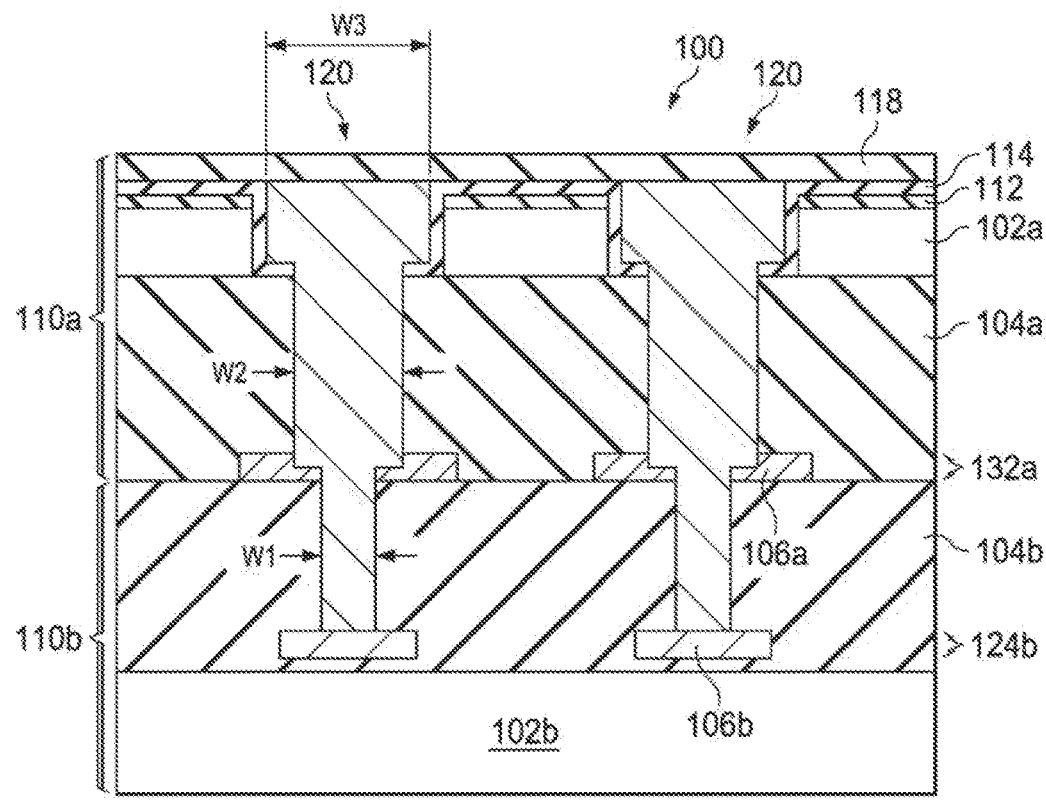

FIGS. 16 through 18 illustrate cross-sectional views of semiconductor devices 100 in accordance with other embodiments, wherein the second conductive features 106b are formed in a bottom conductive line layer 124b or M1 layer of the second semiconductor chip 110b. In FIG. 16, the first conductive features 106a are formed in a contact layer 122a of the first semiconductor chip 110a. In FIG. 17, the first conductive features 106a are formed in a conductive line layer 124a, 126a, 128a, or 130a of the first semiconductor chip 110a. In FIG. 18, the first conductive features 106a are formed in an RDL 132a of the first semiconductor chip 110a. The conductive plugs 120 provide an electrical link from the various conductive material layers 122a, 124a, 126a, 128a, 130a, and 132a of the first semiconductor chip 110a to the bottom conductive line layer 124b of the second semiconductor chip 110b. A portion of the conductive plugs 120 having a width comprising dimension W1 extends through the first conductive features 106a into the IMD 104b of the second semiconductor chip 110b to connect to the second conductive features 106b.

Figure 19:
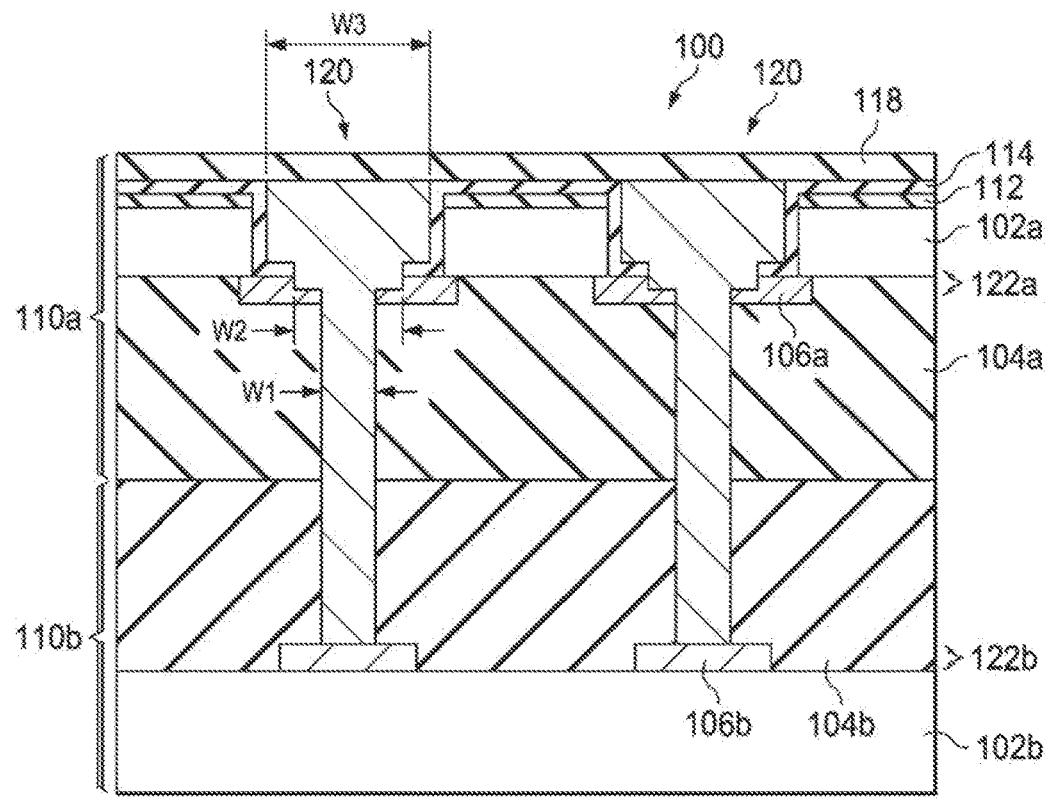
FIGS. 19 through 21 illustrate cross-sectional views of semiconductor devices in accordance with other embodiments.
Figure 20:
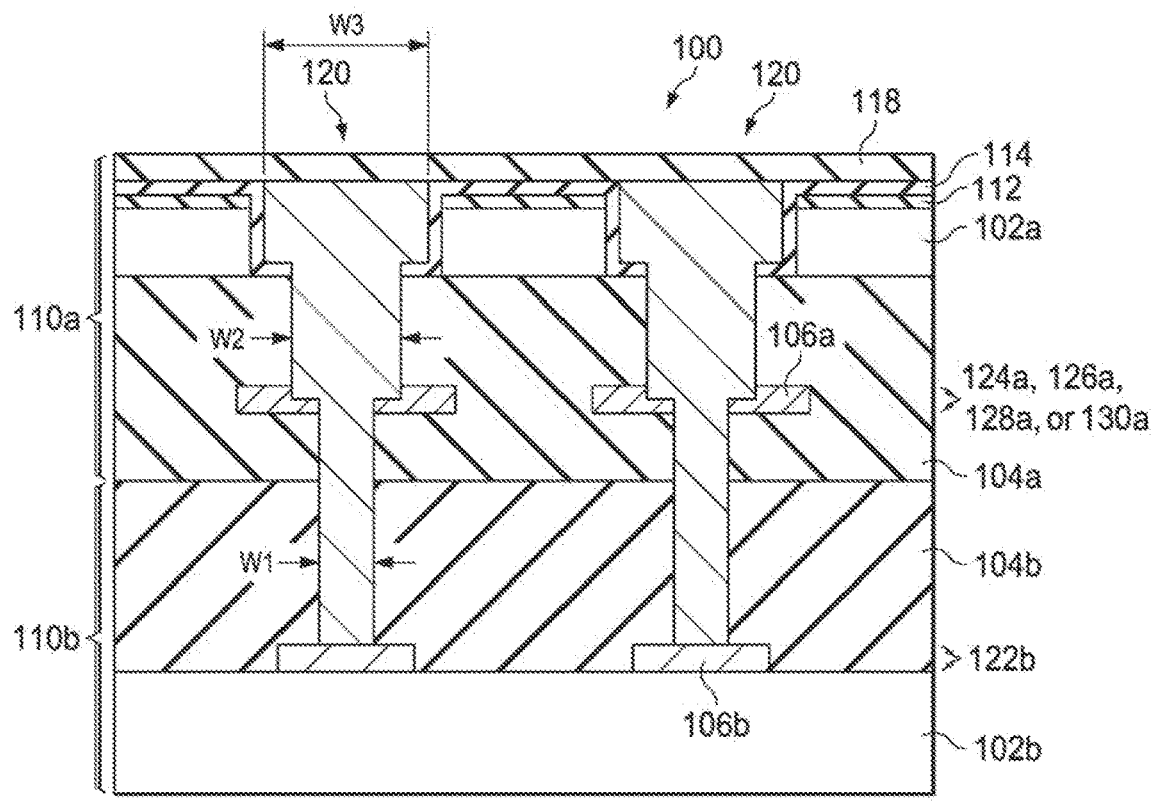
Figure 21:
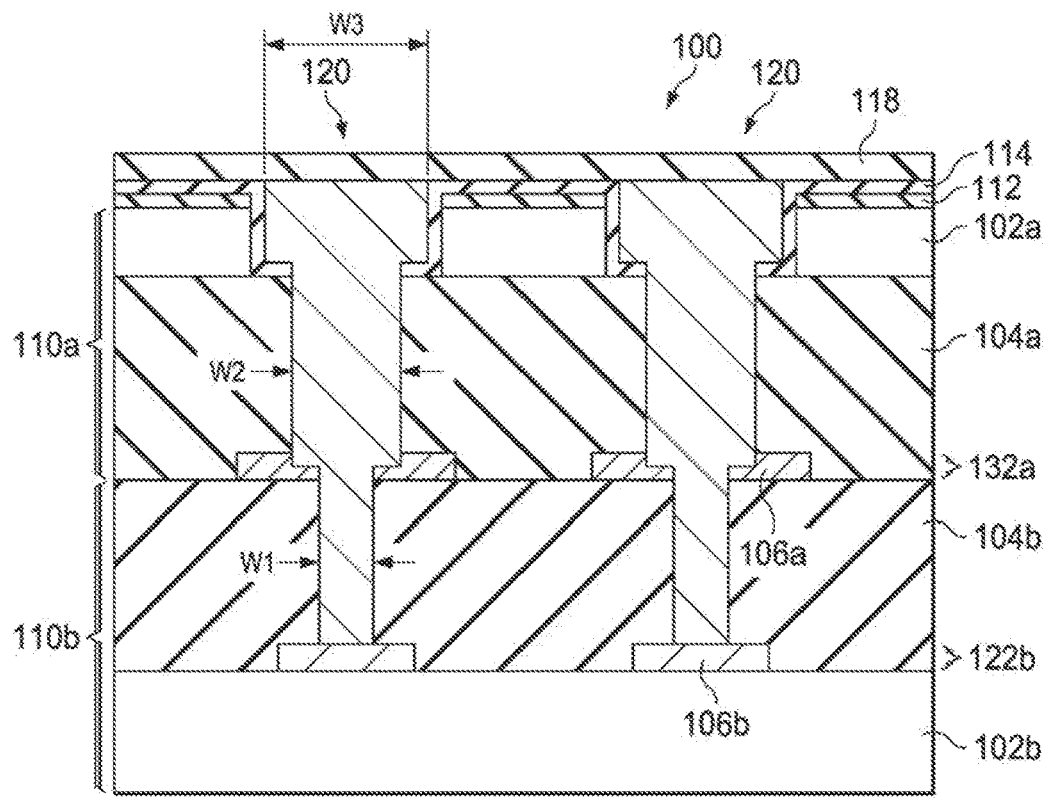

FIGS. 19 through 21 illustrate cross-sectional views of semiconductor devices 100 in accordance with other embodiments, wherein the second conductive features 106b are formed in a contact layer 122b of the second semiconductor chip 110b. In FIG. 19, the first conductive features 106a are formed in a contact layer 122a of the first semiconductor chip 110a. In FIG. 20, the first conductive features 106a are formed in a conductive line layer 124a, 126a, 128a, or 130a of the first semiconductor chip 110a. In FIG. 21, the first conductive features 106a are formed in an RDL 132a of the first semiconductor chip 110a. The conductive plugs 120 provide an electrical link from the various conductive material layers 122a, 124a, 126a, 128a, 130a, and 132a of the first semiconductor chip 110a to the contact layer 122b of the second semiconductor chip 110b. A portion of the conductive plugs 120 having a width comprising dimension W1 extends through the first conductive features 106a into and through the IMD 104b of the second semiconductor chip 110b to connect to the second conductive features 106b.

Thus, in accordance with some embodiments of the present disclosure, the first conductive feature 106a and/or the second conductive feature 106b may comprise a contact in a contact layer, a conductive line in a conductive line layer, or a portion of an RDL in an RDL layer of the first semiconductor chip 110a or the second semiconductor chip 110b, respectively. The first conductive feature 106a may comprise a conductive line in a bottom metallization layer of the first semiconductor chip 110a, in a top metallization layer of the first semiconductor chip 110a, or in a metallization layer disposed between a bottom metallization layer and a top metallization layer of the first semiconductor chip 110a. Likewise, the second conductive feature 106b may comprise a conductive line in a bottom metallization layer of the second semiconductor chip 110b, in a top metallization layer of the second semiconductor chip 110b, or in a metallization layer disposed between a bottom metallization layer and a top metallization layer of the second semiconductor chip 110b.

The conductive plugs 120 are disposed within the IMD 104a or 104b of the first semiconductor chip 110a and/or the second semiconductor chip 110b in accordance with some embodiments. For example, in FIG. 1F and FIGS. 2 through 6, the conductive plugs 120 are disposed within the IMD 104a of the first semiconductor chip 110a. In FIGS. 7 through 18, the conductive plugs 120 are disposed within the IMD 104a of the first semiconductor chip 110a and within a portion of the IMD 104b of the second semiconductor chip 110b. In FIGS. 19 through 21, the conductive plugs 120 are disposed within the IMD 104a of the first semiconductor chip 110a and within the IMD 104b of the second semiconductor chip 110b.

The first semiconductor chip 110a or the second semiconductor chip 110b comprises an application specific integrated circuit (ASIC) device or a system-on-a-chip (SOC) in some embodiments. Alternatively, the first semiconductor chip 110a or the second semiconductor chip 110b may comprise other types of devices and may be adapted to perform other functions. In some embodiments, the semiconductor device 100 comprises a complementary metal oxide semiconductor (CMOS) image sensor device. In some embodiments, the semiconductor device 100 comprises a backside illuminated imaging sensor that includes a semiconductor chip 110b comprising an ASIC device and a semiconductor chip 110a comprising a sensor device and/or SOC, as another example. Alternatively, the semiconductor device 100 may comprise other types of devices.

Figure 22:
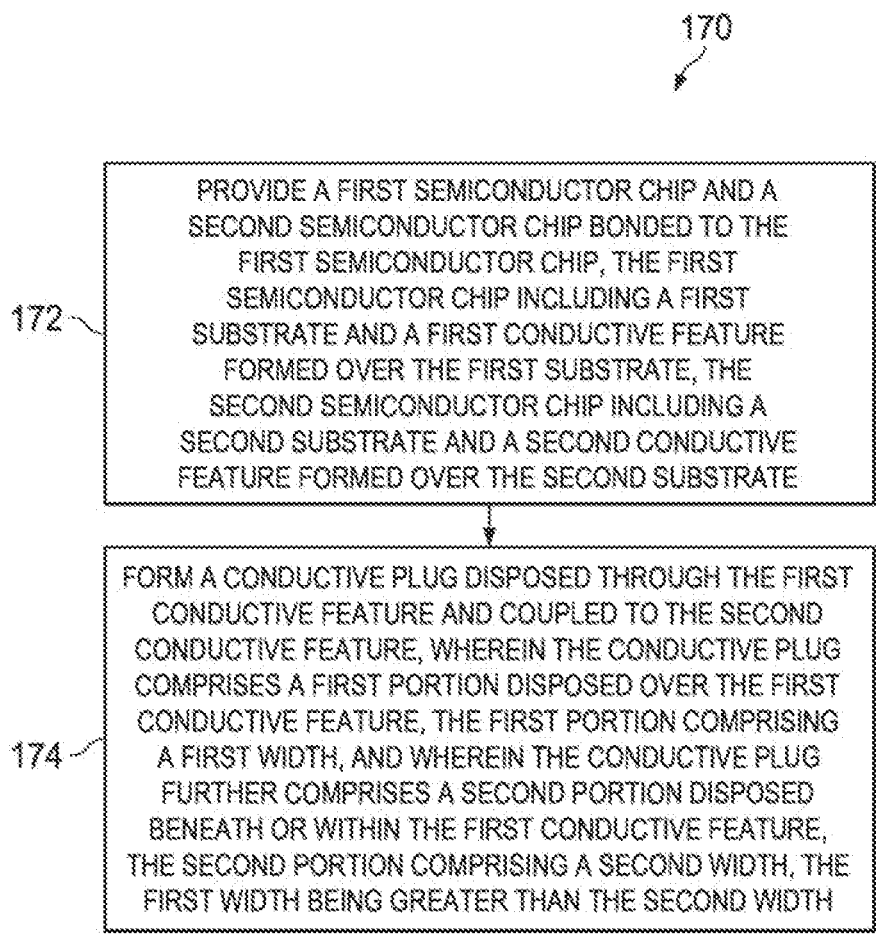
FIG. 22 is a flow chart of a method of manufacturing a semiconductor device in accordance with some embodiments of the present disclosure.

FIG. 22 is a flow chart 170 of a method of manufacturing a semiconductor device 100 in accordance with some embodiments of the present disclosure. In step 172, a first semiconductor chip 110a and a second semiconductor chip 110b bonded to the first semiconductor chip 110a is provided. The first semiconductor chip 110a includes a first substrate 102a and a first conductive feature 106a formed over the first substrate 102a, and the second semiconductor chip 110b includes a second substrate 102b and a second conductive feature 106b formed over the second substrate 102b. In step 174, a conductive plug 120 is formed that is disposed through the first conductive feature 106a and coupled to the second conductive feature 106b. The conductive plug 120 includes a first portion disposed over the first conductive feature 106b, the first portion comprising a first width (e.g., comprising dimension W3). The conductive plug 120 further includes a second portion disposed beneath or within the first conductive feature 106a, the second portion comprising a second width (e.g., comprising dimension W1). The first width is greater than the second width. Forming the second portion of the conductive plug 120 comprises using the first conductive feature 106a as a hard mask during an etch process used to form a pattern for the conductive plug 120 in some embodiments, for example.

Some embodiments of the present disclosure include methods of manufacturing semiconductor devices 100 that include the conductive plugs 120, and also include semiconductor devices 100 that include the novel conductive plugs 120 described herein.

Advantages of some embodiments of the disclosure include providing novel methods of forming interconnects for two or more semiconductor wafers or chips that have been bonded together. The conductive plugs 120 may advantageously be used to interconnect between any conductive material layers of the semiconductive chips. The conductive plugs 120 comprise through-vias that provide vertical electrical connections for semiconductor devices 100. The conductive plugs 120 and also the conductive features 106a and 106b may be comprised of a variety of conductive materials. Furthermore, the novel semiconductor device 100 structures and designs are easily implementable in manufacturing process flows.

In accordance with some embodiments of the present disclosure, a semiconductor device includes a first semiconductor chip including a first substrate and a first conductive feature formed over the first substrate, and a second semiconductor chip bonded to the first semiconductor chip. The second semiconductor chip includes a second substrate and a second conductive feature formed over the second substrate. A conductive plug is disposed through the first conductive feature and is coupled to the second conductive feature. The conductive plug includes a first portion disposed over the first conductive feature, the first portion having a first width, and a second portion disposed beneath or within the first conductive feature. The second portion has a second width. The first width is greater than the second width.

In accordance with other embodiments, a semiconductor device includes a first semiconductor chip including a first substrate and a first conductive feature formed over the first substrate. The first conductive feature is disposed in a contact layer, a conductive line layer, or an RDL of the first semiconductor chip. The semiconductor device includes a second semiconductor chip bonded to the first semiconductor chip, the second semiconductor chip including a second substrate and a second conductive feature formed over the second substrate. The second conductive feature is disposed in a contact layer, a conductive line layer, or an RDL of the second semiconductor chip. A conductive plug is disposed through the first conductive feature and is coupled to the second conductive feature. The conductive plug includes a first portion disposed over the first conductive feature, the first portion comprising a first width, and a second portion disposed beneath or within the first conductive feature, the second portion comprising a second width. The first width is greater than the second width. The conductive plug includes a third portion disposed between the first portion and the first conductive feature, the third portion comprising a third width. The third width is greater than the second width and less than the first width.

In accordance with other embodiments, a method of manufacturing a semiconductor device includes providing a first semiconductor chip and a second semiconductor chip bonded to the first semiconductor chip. The first semiconductor chip includes a first substrate and a first conductive feature formed over the first substrate. The second semiconductor chip includes a second substrate and a second conductive feature formed over the second substrate. The method includes forming a conductive plug that is disposed through the first conductive feature and coupled to the second conductive feature. The conductive plug comprises a first portion disposed over the first conductive feature, the first portion comprising a first width. The conductive plug further comprises a second portion disposed beneath or within the first conductive feature, the second portion comprising a second width. The first width is greater than the second width.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method, comprising:
    providing a first semiconductor chip comprising a first electrically conductive feature in a first dielectric layer, the first electrically conductive feature surrounding a first opening with a first width, a first portion of the first dielectric layer being disposed in the first opening;
    bonding the first semiconductor chip to a second semiconductor chip such that the first electrically conductive feature of the first semiconductor chip is directly bonded to a second electrically conductive feature of the second semiconductor chip and a second portion of the first dielectric layer of the first semiconductor chip is directly bonded to a second dielectric layer of the second semiconductor chip, the first semiconductor chip comprising a first substrate, and the second semiconductor chip comprising a second substrate, wherein bonding the first semiconductor chip to the second semiconductor chip comprises directly contacting the first portion of the first dielectric layer in the first opening with the second electrically conductive feature;
    after bonding the first semiconductor chip to the second semiconductor chip, patterning a second opening extending from a backside of the first semiconductor chip to the first opening, wherein the first opening and the second opening collectively expose the second electrically conductive feature, and wherein patterning the second opening comprises:
        patterning a first portion of the second opening disposed over the first electrically conductive feature, the first portion of the second opening comprising a second width;
        patterning a second portion of the second opening disposed at least partially within the first electrically conductive feature, the second portion of the second opening comprising a third width, the second width is greater than the third width, and the third width is greater than the first width; and
    filling the first opening and the second opening with a conductive material to provide a conductive plug electrically connected to the first electrically conductive feature and the second electrically conductive feature.

2. The method of claim 1, wherein the first portion of the second opening is disposed in the first substrate.

3. The method of claim 1, wherein patterning the second portion of the second opening comprises widening an upper portion of the first opening without widening a lower portion of the first opening.

4. The method of claim 1, further comprising depositing a dielectric liner over the first substrate and along sidewalls and a bottom surface of the first portion of the second opening.

5. The method of claim 4, further comprising depositing a bottom anti-reflection coating (BARC) layer over the first substrate prior to depositing the dielectric liner.

6. The method of claim 4, wherein the dielectric liner is deposited prior to patterning the second portion of the second opening.

7. A method, comprising:
    directly bonding a first semiconductor chip to a second semiconductor chip, wherein a first electrically conductive feature of the first semiconductor chip is directly bonded to a second electrically conductive feature of the second semiconductor chip, wherein the first electrically conductive feature is disposed in a first insulating bonding layer, wherein a first portion of the first insulating bonding layer is disposed in a first opening extending through the first electrically conductive feature, and wherein directly bonding the first semiconductor chip to the second semiconductor chip comprises directly contacting the first portion of the first insulating bonding layer in the first opening with the second electrically conductive feature;
    forming a conductive plug extending through the first semiconductor chip, the conductive plug having:
        a first width in a first semiconductor substrate of the first semiconductor chip;
        a second width extending from the first semiconductor substrate into a top portion of the first electrically conductive feature, the second width being less than the first width, and the second width being measured from a first sidewall of the top portion of the first electrically conductive feature to a second sidewall of the top portion of the first electrically conductive feature; and
        a third width in a bottom portion of the first electrically conductive feature, the third width being less than the second width, the third width being measured from a third sidewall of the bottom portion of the first electrically conductive feature to a fourth sidewall of the bottom portion of the first electrically conductive feature.

8. The method of claim 7, wherein the second electrically conductive feature has a fourth width that is wider than the second width and the third width.

9. The method of claim 7, wherein the conductive plug extends to the second electrically conductive feature.

10. The method of claim 7, further comprising:
    after directly bonding the first semiconductor chip to the second semiconductor chip, patterning a second opening in the first semiconductor substrate;
    depositing a dielectric liner along sidewalls and a bottom surface of the second opening; and
    patterning a third opening through the dielectric liner, the third opening extending to the top portion of the first electrically conductive feature.

11. The method of claim 10, wherein patterning the third opening connects the first opening to the second opening, wherein the method further comprises removing the first portion of the first insulating bonding layer through the third opening, and wherein forming the conductive plug comprises filling the first opening, the second opening, and the third opening with a conductive material.

12. The method of claim 10, further comprising depositing a bottom anti-reflection coating (BARC) layer between a backside of the first semiconductor substrate, wherein depositing the dielectric liner comprises depositing the dielectric liner over the BARC layer.

13. A method, comprising:
bonding a first semiconductor chip to a second semiconductor chip, the first semiconductor chip including a first substrate and a first electrically conductive feature, the second semiconductor chip including a second substrate and a second electrically conductive feature, bonding the first semiconductor chip to the second semiconductor chip comprises directly bonding the first electrically conductive feature to the second electrically conductive feature, wherein the first electrically conductive feature is disposed in a first insulating bonding layer, wherein a portion of the first insulating bonding layer is disposed in a first opening extending through the first electrically conductive feature, and wherein directly bonding the first semiconductor chip to the second semiconductor chip comprises directly contacting the portion of the first insulating bonding layer in the first opening with the second electrically conductive feature; and
forming a conductive plug disposed through the first electrically conductive feature and coupled to the second electrically conductive feature, wherein the conductive plug comprises:
a first portion disposed in a first semiconductor substrate of the first semiconductor chip, the first portion comprising a first width;
a second portion extending from the first portion of the conductive plug into the first electrically conductive feature, the second portion comprising a second width that is measured between first opposing sidewalls of the first electrically conductive feature, wherein forming the second portion comprises widening an upper portion of the first opening; and
a third portion extending from the second portion of the conductive plug to the second electrically conductive feature, the third portion having a third width that is measured between second opposing sidewalls of the first electrically conductive feature, the first width being different from the second width and the third width, and the second width being different from the third width, wherein forming the second portion and the third portion comprises removing the portion of the first insulating bonding layer.

14. The method of claim 13, wherein the first width is greater than the second width, and wherein the third width is less than the second width.

15. The method of claim 13, wherein the first electrically conductive feature, the second electrically conductive feature, or the conductive plug comprises a material selected from the group consisting essentially of W, Cu, AlCu, polysilicon, and combinations thereof.

16. The method of claim 13, wherein the third portion of the conductive plug is disposed entirely within the first electrically conductive feature.

17. The method of claim 13, wherein the first electrically conductive feature is disposed in a first dielectric layer, wherein the second electrically conductive feature is disposed in a second dielectric layer, and wherein bonding the first semiconductor chip to the second semiconductor chip comprises directly bonding the first dielectric layer to the second dielectric layer.

18. The method of claim 13, further comprising forming a dielectric layer on sidewalls and a bottom surface of the first portion of the conductive plug.

19. The method of claim 13, wherein the second electrically conductive feature has a fourth width that is different from the first width, the second width, and the third width.

20. The method of claim 19, wherein the fourth width is greater than the second width and the third width, and wherein the fourth width is less than the first width.

* * * * *